(12) United States Patent
Tsai et al.

(10) Patent No.: US 8,115,218 B2
(45) Date of Patent: Feb. 14, 2012

(54) LIGHT EMITTING DIODE PACKAGE STRUCTURE AND METHOD FOR FABRICATING THE SAME

(75) Inventors: Yao-Jun Tsai, Taoyuan County (TW); Chen-Peng Hsu, Kaohsiung (TW); Chao-Wei Li, Taipei (TW); Hung-Lieh Hu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 289 days.

(21) Appl. No.: 12/501,496

(22) Filed: Jul. 13, 2009

(65) Prior Publication Data

US 2009/0267102 A1    Oct. 29, 2009

Related U.S. Application Data

(63) Continuation-in-part of application No. 12/126,935, filed on May 26, 2008, now Pat. No. 7,923,746.

(30) Foreign Application Priority Data

Mar. 12, 2008 (CN) .......................... 2008 1 0083769

(51) Int. Cl.
*H01L 33/00* (2010.01)
(52) U.S. Cl. ..................... 257/89; 257/98; 257/E33.067

(58) Field of Classification Search ............. 257/89, 257/98, E33.067
See application file for complete search history.

(56) References Cited

U.S. PATENT DOCUMENTS 6,650,044 B1   11/2003 Lowery
2007/0121327 A1*   5/2007 Chen et al. .................... 362/294

FOREIGN PATENT DOCUMENTS

CN   1487605   4/2004
CN   200972865   11/2007

OTHER PUBLICATIONS

Chen et al, High Thermal Dissipation of Ultra High Power Light-Emitting Diodes by Copper Electroplating, IEEE Electronic Components and Technology Conference 2007.
"1st Office Action of China Counterpart Application" issued on May 21, 2010, p. 1-p. 6.

* cited by examiner

*Primary Examiner* — Lex Malsawma
(74) *Attorney, Agent, or Firm* — Jianq Chyun IP Office

(57) ABSTRACT

A light emitting diode (LED) package structure includes a carrier, a first protrusion, a LED chip, and an adhesion layer. The first protrusion is disposed on the carrier and has a first opening to expose the carrier. The LED chip is disposed in the first opening on the carrier, and a ratio between a width of the first opening and a width of the LED chip is 1~1.5. The adhesion layer is disposed between the LED chip and the carrier to bond the LED chip to the carrier.

20 Claims, 27 Drawing Sheets

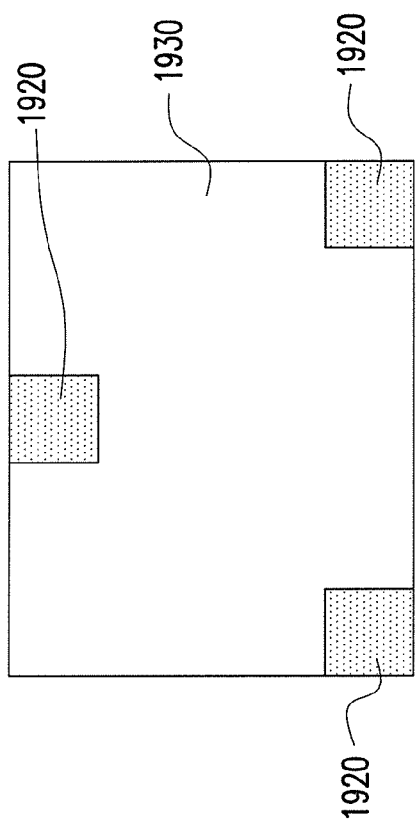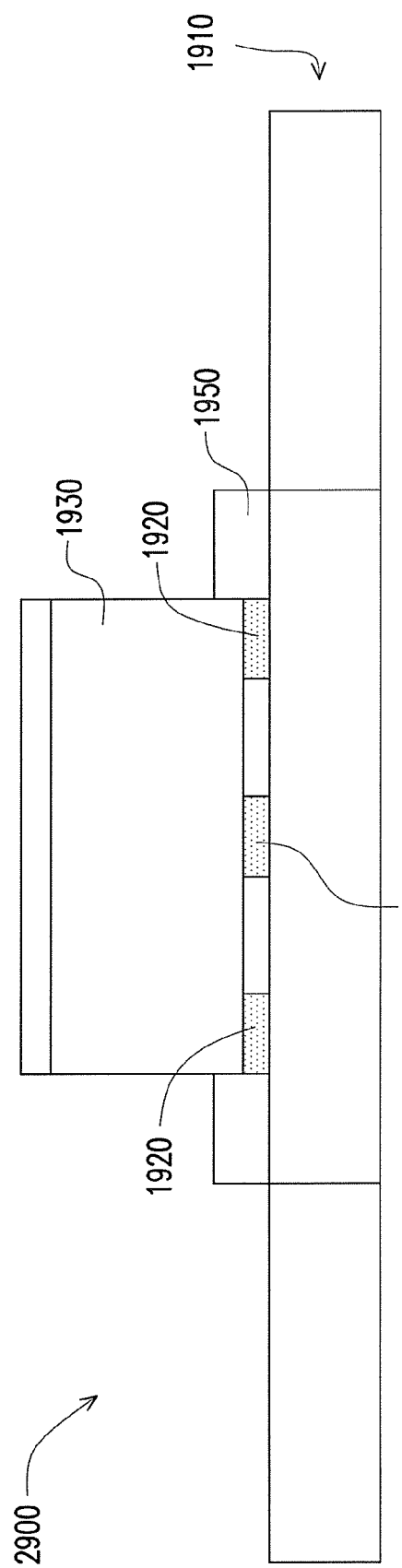

LIGHT EMITTING DIODE PACKAGE STRUCTURE AND METHOD FOR FABRICATING THE SAME

CROSS-REFERENCE TO RELATED APPLICATION

This is a continuation-in-part application of and claims the priority benefit of patent application Ser. No. 12/126,935, filed on May 26, 2008, which claims the priority benefit of Chinese application Serial No. 200810083769.9, filed on Mar. 12, 2008. The entirety of each of the above-mentioned patent applications is hereby incorporated by reference herein and made a part of this specification.

TECHNICAL FIELD

The present invention relates to a light emitting diode package structure, and particularly relates to a light emitting diode package structure having high thermal conduction efficiency.

BACKGROUND

In recent years, luminescence efficiency of light emitting diodes (LED) has been constantly improved. Consequently, fluorescent lamps and incandescent bulbs are gradually replaced with LEDs in some fields, such as scanning light source which requires high speed response, back or front light source of a liquid crystal display (LCD), automobile dashboard illumination, traffic signs, and general illumination devices. Typical LEDs are usually semiconductor devices which use III-V compounds, such as GaP, GaAs, and so on. LEDs convert electrical energy into light. When an electric current is applied to a semiconductor device with the aforesaid compounds, energy is released in the form of light through the combination of electron and electron hole. LEDs have advantages, such as faster response (about $10^{-9}$ S), smaller size, lower power consumption, less pollution, higher reliability, and capability for mass production. Accordingly, LEDs are widely applied in many fields.

FIG. 1 is a schematic cross-sectional view depicting a conventional light emitting diode package structure. Referring to FIG. 1, a conventional light emitting diode package structure 100 consists of a LED chip 110, a carrier 120, a conductive line 132, a conductive line 134, and a molding compound 140. Herein, the LED chip 110 is disposed on the carrier 120, and the conductive line 132 and the conductive line 134 electrically connect the LED chip 110 with the carrier 120 respectively. The molding compound 140 is disposed on the carrier 120 and covers the conductive line 132 and the conductive line 134. The LED chip 110 is applied voltage difference through the conductive line 132 and the conductive line 134, and thereby a light emitting layer 112 of the LED chip 110 emits light and generates heat.

It is noted that the carrier 120 and the molding compound 140 of the conventional light emitting diode package structure 100 have poor thermal conduction efficiency. Consequently, heat generated by the light emitting layer 112 of the LED chip 110 can not be released effectively. When a high electric current is applied, the LED chip 110 is easily damaged for being overheated. Hence, a conventional method, which uses a thermal conductive material, such as metal, to fabricate the carrier 120, is provided to improve the thermal conduction efficiency of a bottom 114 of the light emitting diode package structure 100. However, such a method does not improve the thermal conduction efficiency of a sidewall 116 of the LED chip 110.

SUMMARY

In one embodiment, a light emitting diode (LED) package structure comprises a carrier, a first protrusion, a LED chip, and an adhesion layer. Herein, the first protrusion is disposed on the carrier and has a first opening to expose the carrier. The LED chip is disposed in the first opening on the carrier, and a ratio between a width of the first opening and a width of the LED chip is 1 approximately, such that an inner sidewall of the first opening is attached to a sidewall of the LED chip. The adhesion layer is disposed between the LED chip and the carrier to bond the LED chip to the carrier.

In another embodiment, a light emitting diode (LED) package structure comprises a carrier, a first protrusion, a LED chip, and an adhesion layer. Herein, the first protrusion is disposed on the carrier and has a first opening to expose the carrier. The LED chip is disposed in the first opening on the carrier, and a ratio between a width of the first opening and a width of the LED chip is larger than 1 and smaller than or equal to 1.5 such that a gap exists between a sidewall of the LED chip and an inner sidewall of the first opening. The adhesion layer is disposed between the LED chip and the carrier to bond the LED chip to the carrier.

In another embodiment, a method for fabricating a light emitting diode package structure described as follows. First, a carrier having a first surface is provided. Then, an adhesion layer and a LED chip are disposed on the first surface of the carrier, wherein the adhesion layer is bonded between the LED chip and the carrier, and the LED chip comprises a second surface away from the carrier. Next, a first thermal-conductive material layer is formed on the first surface, wherein the first thermal-conductive material layer comprises a first opening to expose the LED chip, and an inner sidewall of the first opening is attached to a sidewall of the LED chip.

In another embodiment, a method for fabricating a light emitting diode package structure described as follows. A carrier having a recess is provided. Then, an adhesion layer and a LED chip are disposed on a bottom of the recess, and the adhesion layer is bonded between the carrier and the LED chip. A ratio between a width of the recess and a width of the LED chip is larger than 1 and smaller than or equal to 1.5, and therefore a gap exists between a sidewall of the LED chip and an inner sidewall of the recess.

In another embodiment, a method for fabricating a light emitting diode (LED) package structure, comprising providing a temporary substrate and an adhesion layer disposed thereon wherein a material of the adhesion layer is a removable material; disposing a plurality of LED chips on the temporary substrate wherein the LED chips are partially embedded in the adhesion layer respectively; forming a film on the adhesion layer wherein the film covers the LED chips fully; singulating the temporary substrate and the adhesion layer into a plurality of LED chip units and each LED chip unit has a LED chip, a first film, a first adhesion layer and a first temporary substrate; disposing the LED chip unit on a carrier reversely wherein the first film is between the LED chip and the carrier and an adhesion layer is disposed between the first film and the carrier; forming a first protrusion formed by a thermal conductive material on the carrier wherein the first protrusion has a first opening to expose the LED chip and a ratio between a width of the first opening and a width of the LED chip being larger than 1 and smaller than or equal to 1.5; and removing the first adhesion layer and the first temporary substrate so as to expose the LED chip.

In another embodiment, a light emitting diode (LED) package structure comprises a carrier, a LED chip, a thermal conductive layer, a film and an adhesion layer. The carrier has a recess and the LED chip disposed in the recess. The thermal conductive layer is disposed on the carrier and in the recess wherein the portion of the thermal conductive layer in the recess is between the LED chip and the carrier and the thermal conductive layer has an opening and the LED chip is disposed therein and a ratio between a first width of the opening and a second width of the LED chip being larger than 1 and smaller than or equal to 1.5. The film is disposed on a sidewall and a bottom of the LED chip and the adhesion layer is disposed between the LED chip and the carrier.

In another embodiment, a light emitting diode (LED) package structure comprises: a carrier; a pedestal disposed on the carrier and having a first recess wherein a bottom of the first recess has an opening exposing the carrier; a thermal conductive layer disposed in the first recess and has a second recess having an inside wall including a tilt wall, a vertical wall and a horizontal wall wherein the vertical wall connects the tilt wall to the horizontal wall; a LED chip disposed in the second recess and on the horizontal wall wherein a ratio between a minimum width of the second recess and a second width of the LED chip being larger than 1 and smaller than or equal to 1.5; a film disposed on the inside wall; and an adhesion layer disposed in the opening and between the thermal conductive layer and the carrier.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

To make the above purposes, features, and advantages of the present invention more comprehensible, preferable embodiments accompanied by drawings are detailed as follows.

FIG. 29A is a schematic cross-sectional view depicting a LED package structure according to an embodiment and FIG. 29B is a schematic top view depicting the LED chip in FIG. 29A.

DESCRIPTION OF EMBODIMENTS

Figure 2:
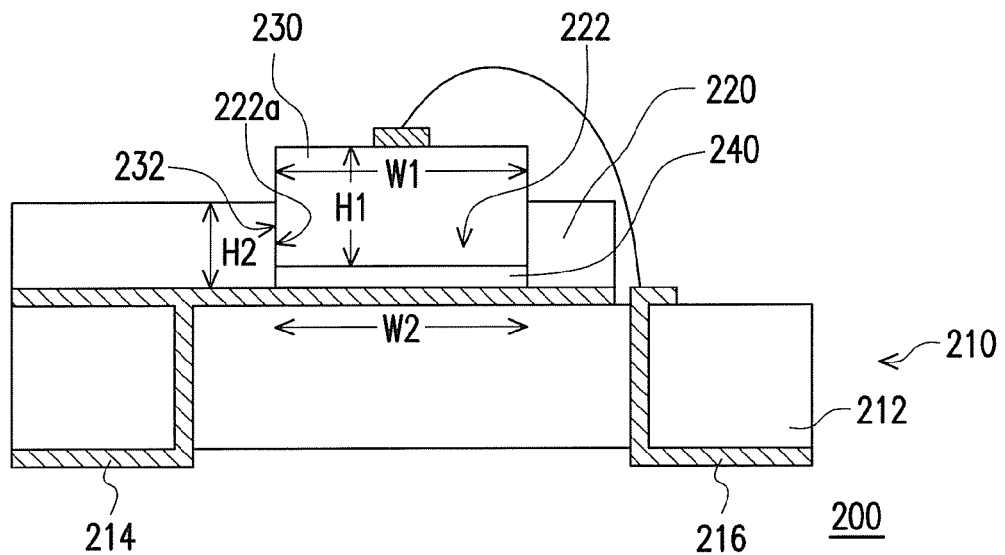
FIG. 2 is a schematic cross-sectional view depicting a light emitting diode package structure according to an embodiment.

FIG. 2 is a schematic cross-sectional view depicting a light emitting diode package structure according to an embodiment. Referring to FIG. 2, in this embodiment, a light emitting diode package structure 200 comprises a carrier 210, a first protrusion 220, a LED chip 230, and an adhesion layer 240. Herein, the first protrusion 220 is disposed on the carrier 210 and has a first opening 222 to expose the carrier 210. The first protrusion 220 may comprise a thermal-conductive material layer. In addition, a material of the thermal-conductive material layer may comprise gold, silver, copper, indium, titanium, zinc, aluminum, lead, tin, nickel, platinum, chromium, or a combination of alloys thereof. Certainly, in other embodiments, the first protrusion may comprise a stack of a plurality of thermal-conductive material layers. In addition, a material of the stack of thermal-conductive material layers may comprise gold, silver, copper, indium, titanium, zinc, aluminum, lead, tin, nickel, platinum, chromium, or a combination of alloys thereof. Furthermore, the carrier 210 may comprise a substrate 212, a first conductive structure 214, and a second conductive structure 216. The first conductive structure 214 and the second conductive structure 216 respectively pass through the substrate 212.

The LED chip 230 is disposed in the first opening 222 on the carrier 210. A ratio between a width W2 of the first opening 222 and a width W1 of the LED chip 230 is 1, and therefore an inner sidewall 222a of the first opening 222 is attached to a sidewall 232 of the LED chip 230. In this embodiment, the width W1 (the widest portion) of the LED chip 230 and the width W2 of the first opening 222 are referred in the same cross-section.

It is noted that the present invention is not intended to limit the relative heights of the first protrusion 220 and the LED chip 230. It is to say that a height H1 of the LED chip 230 may be larger than, smaller than, or equal to a height H2 of the first protrusion 220. In addition, the first conductive structure 214 and the second conductive structure 216 are electrically connected with the LED chip 230 respectively. The adhesion layer 240 is bonded between the LED chip 230 and the carrier 210 to bond the LED chip 230 to the carrier 210. A material of the adhesion layer 240 is, for example, silver paste, solder, glass, alloy, or other suitable thermal conductive materials. Hence, the adhesion layer 240 helps to improve the thermal conduction efficiency of the LED chip 230.

Figure 1:
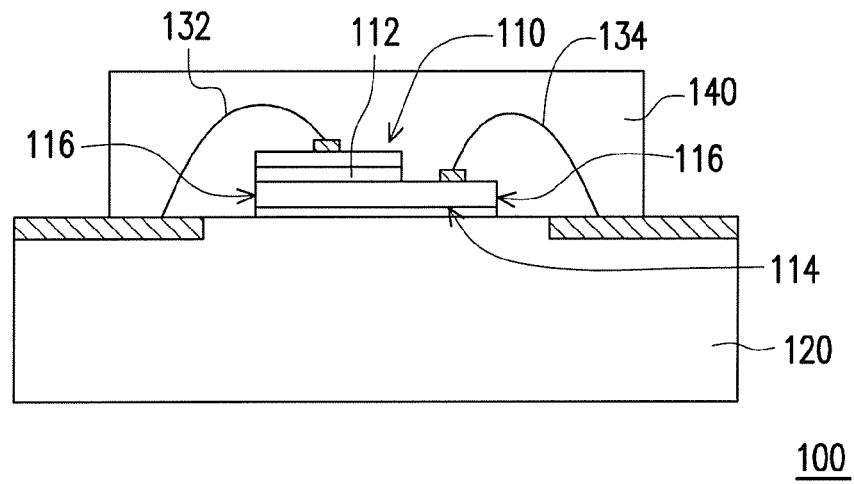
FIG. 1 is a schematic cross-sectional view depicting a conventional light emitting diode package structure.

In view of the above, the light emitting diode package structure 200 in this embodiment comprises the first protrusion 220 formed by a thermal conductive material, and the first protrusion 220 is attached to the sidewall 232 of the LED chip 230. Moreover, compared with a conventional carrier 120 (referring to FIG. 1), the first protrusion 220 is closer to a light emitting layer (not shown) of the LED chip 230. Consequently, the first protrusion 220 in this embodiment helps to increase the thermal conduction efficiency of the sidewall 232 of the LED chip 230, and release the heat generated by the light emitting layer of the LED chip 230. Therefore, the first protrusion 220 in this embodiment helps the light emitting diode package structure 200 to prevent reducing light emitting efficiency or damaging the LED chip 230.

The heat generated by the LED chip within the light emitting diode package structure in this embodiment is removed through the first protrusion attached to the sidewall of the LED chip so as to enhance the thermal conduction efficiency of the light emitting diode package structure. Persons skilled in this art may make some modifications without departing from the spirit and scope of the present invention. In addition, a variety of the light emitting diode package structure 200 is described as follows.

In the present embodiments, an insulating substrate, a leadframe, or a carrier substrate may serve as a substrate 212 depending on requirements. In this embodiment, the substrate 212 is the insulating substrate. A material of the insulating substrate is, for example, ceramic. However, this embodiment is not limited thereto. The insulating substrate may also be formed by other suitable insulating materials.

Figure 3:
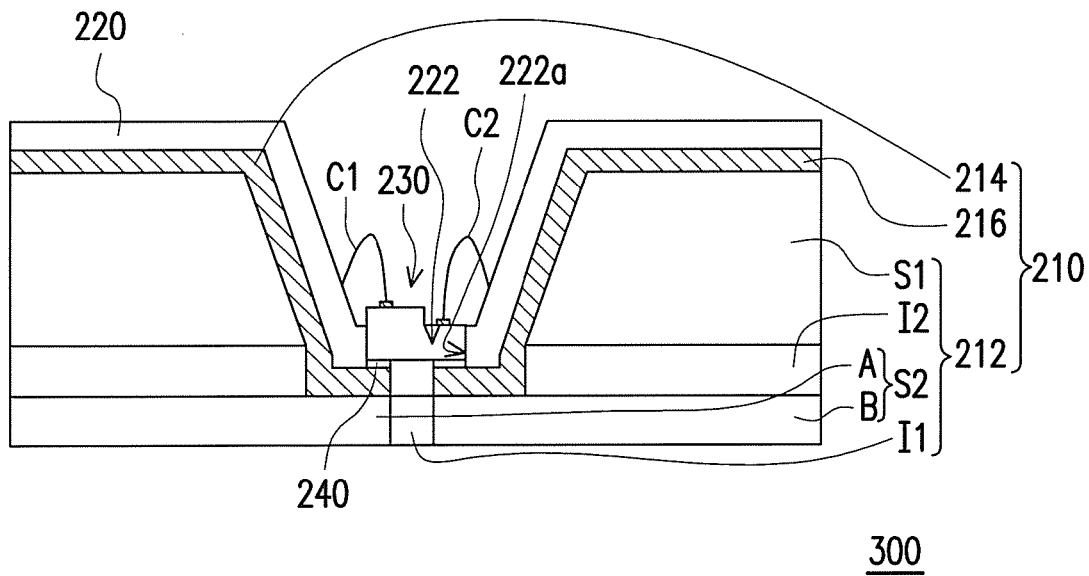
FIGS. 3~8 are schematic cross-sectional views depicting a variety of the light emitting diode package structure in FIG. 2.

FIGS. 3~8 are schematic cross-sectional views depicting a variety of the light emitting diode package structure in FIG. 2. Referring to FIG. 3, in this embodiment, a light emitting diode package structure 300 is similar to the light emitting diode package structure 200, and the difference lies in that the light emitting diode package structure 300 and the light emitting diode package structure 200 comprise different carriers 210. The carrier 210 of the light emitting diode package structure 300 may comprise the substrate 212, a first conductive structure 214, a second conductive structure 216. The LED chip 230 is disposed on the substrate 212, and the first conductive structure 214 and the second conductive structure 216 are respectively disposed on the substrate 212 on two sides of the LED chip 230.

Figure 4:
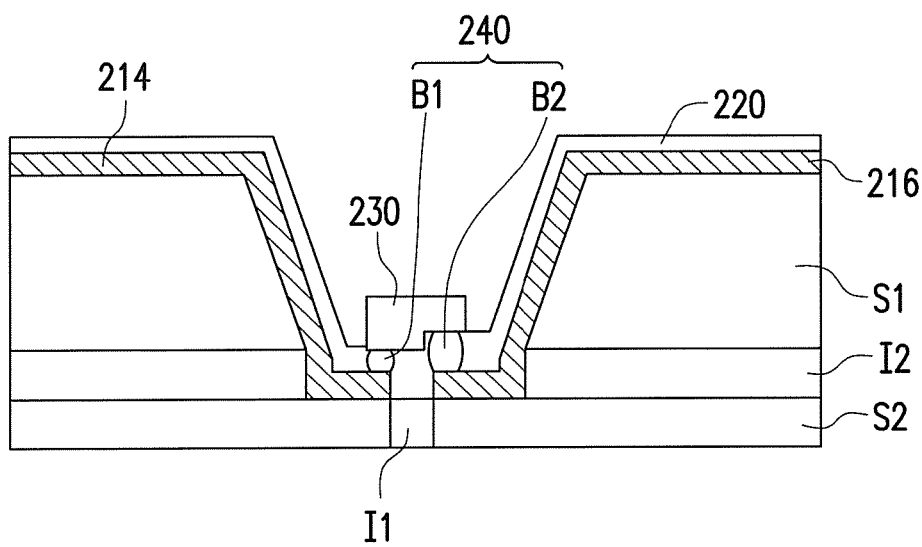

In this embodiment, the substrate 212 is, for example, a silicon-on-insulator (SOI). For instance, the substrate 212 comprises a first semiconductor layer S1, a second semiconductor layer S2, an insulating strip I1, and an insulating layer I2 arranged between the first semiconductor layer S1 and the second semiconductor layer S2. The insulating strip I1 is disposed in the second semiconductor layer S2 to divide the second semiconductor layer S2 into a first portion A and a second portion B. The first portion A is electrically connected with the first conductive structure 214, and the second portion B is electrically connected with the second conductive structure 216. Herein, a material of the first semiconductor layer S1 and the second semiconductor layer S2 is silicon, for example. A material of the insulating strip I1 and the insulating layer I2 is, for example, silicon oxide ($SiO_2$). In addition, the first conductive structure 214 and the second conductive structure 216 are electrically connected with the LED chip 230 respectively through a first conductive line C1 and a second conductive line C2. Referring to FIG. 4, in other embodiments, the adhesion layer 240 may comprise a first conductive bump B1 and a second conductive bump B2, and the first conductive structure 214 and the second conductive structure 216 are electrically connected with the LED chip 230 respectively through the first conductive bump B1 and the second conductive bump B2.

Figure 5:
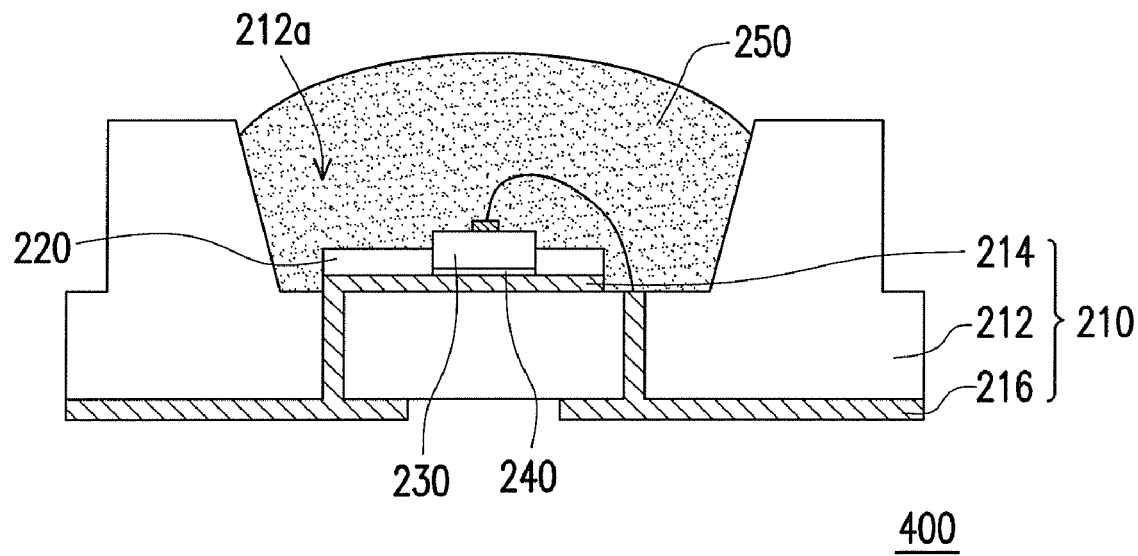

Referring to FIG. 5, in this embodiment, a light emitting diode package structure 400 is similar to the light emitting diode package structure 200, and the difference lies in that the light emitting diode package structure 400 and the light emitting diode package structure 200 comprise different carriers 210. In this embodiment, the substrate 212 of the carrier 210 comprises a recess 212a, and the LED chip 230 is disposed in the recess 212a on the substrate 212. Moreover, the light emitting diode package structure 200 further comprises a fluorescent material layer 250 disposed in the recess 212a to cover the LED chip 230.

Figure 6:
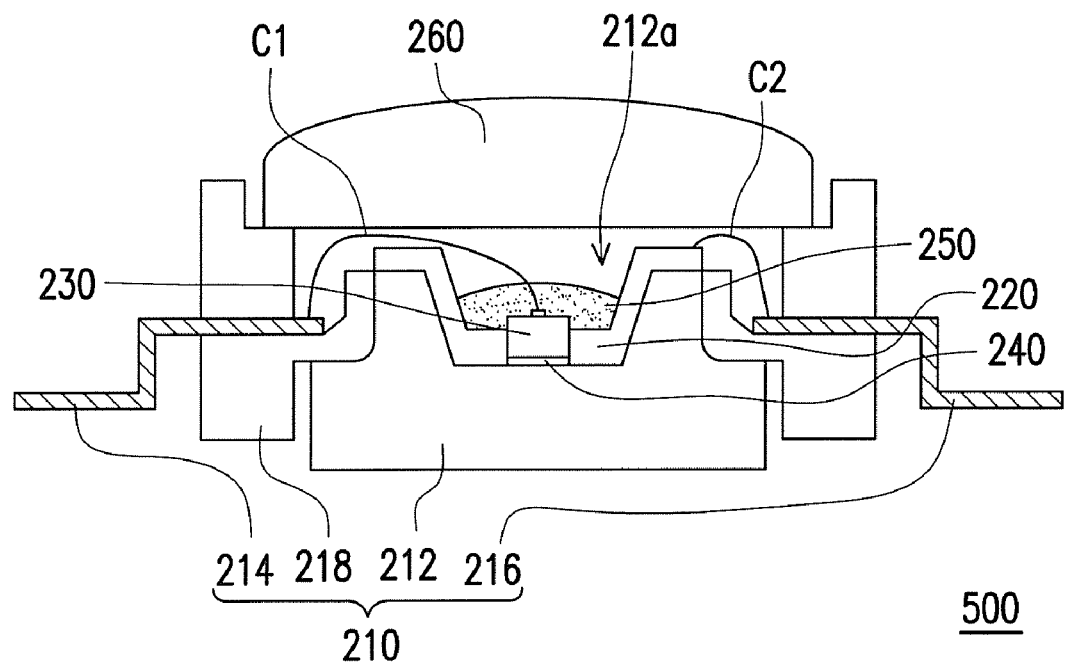

Referring to FIG. 6, in this embodiment, a light emitting diode package structure 500 is similar to the light emitting diode package structure 400, and the difference lies in that the light emitting diode package structure 500 and the light emitting diode package structure 400 comprise different carriers 210. In this embodiment, the carrier 210 further comprises a housing 218, and the first conductive structure 214 and the second conductive structure 216 respectively pass through the housing 218.

In this embodiment, the substrate 212 is formed by a conductive material, and the housing 218 is formed by an insulating material. The conductive material is, for example, copper, aluminum, or other suitable conductive materials. The LED chip 230 is electrically connected with the substrate 212 through the adhesion layer 240, and the substrate 212 is electrically connected with the second conductive structure 216 through the second conductive line C2. In addition, the LED chip 230 is electrically connected with the first conductive structure 214 through the first conductive line C1. Furthermore, the light emitting diode package structure 500 may comprise an optical lens 260 disposed on the recess 212a.

Figure 7:
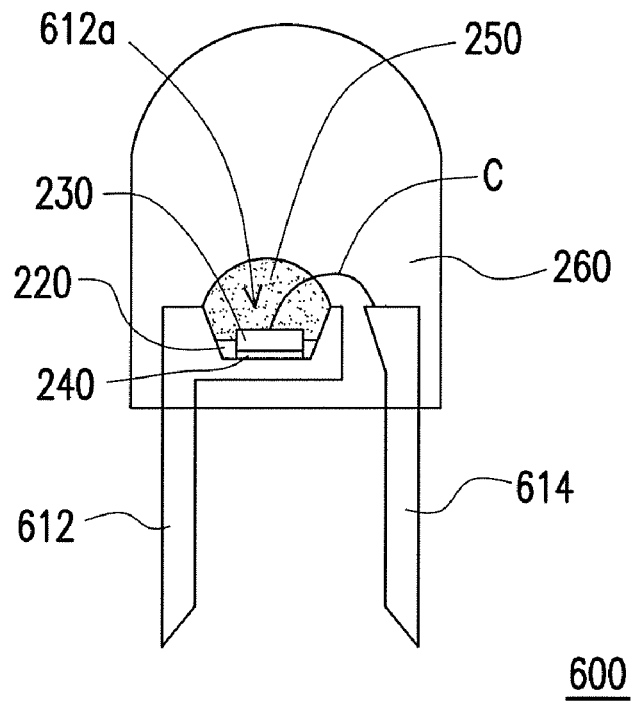

Referring to FIG. 7, in other embodiments, a carrier of a light emitting diode package structure 600 is, for example, a first leadframe 612 having a recess 612a. The LED chip 230 is disposed in the recess 612a and electrically connected with the first leadframe 612. In addition, the light emitting diode package structure 600 further comprises a second leadframe 614, a conductive line C, a molding compound 260, and a fluorescent material layer 250. Herein, the LED chip 230 is electrically connected with the second leadframe 614 through the conductive line C. The fluorescent material layer 250 is disposed in the recess 612a to cover the LED chip 230. Furthermore, the molding compound 260 covers the conductive line C.

Figure 8:
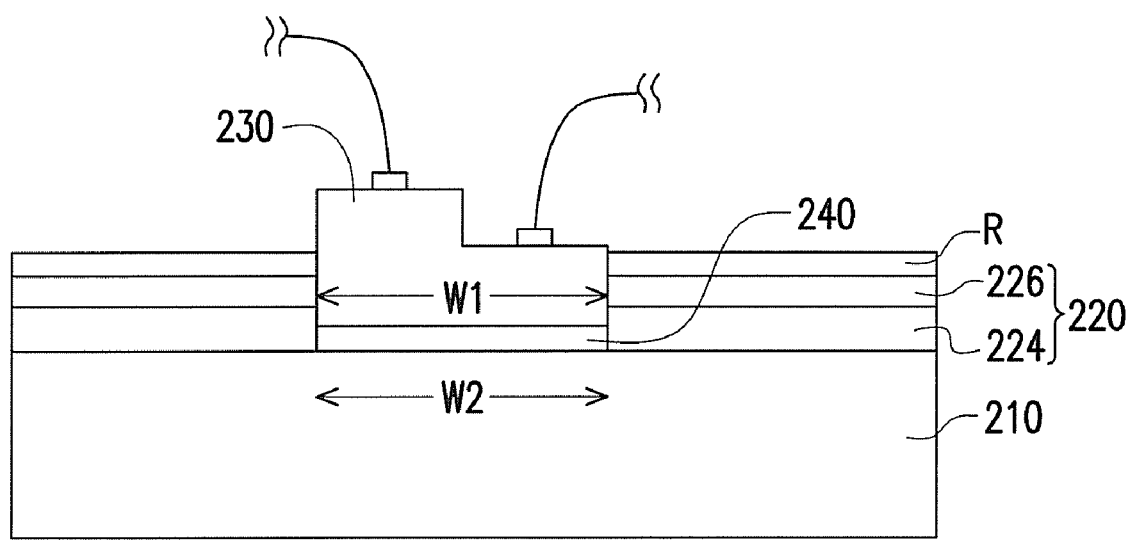

FIG. 8 is a schematic cross-sectional view depicting a light emitting diode package structure according to another embodiment of the present invention. Referring to FIG. 8, in other embodiments, a light emitting diode package structure 700 may further comprise a reflective layer R disposed on the first protrusion 220 depending on requirements. The first protrusion 220 comprises the first thermal-conductive material layer 224 and the second thermal-conductive material layer 226 arranged between the first thermal-conductive material layer 224 and the reflective layer R, wherein the first thermal-conductive material layer 224 is disposed on the carrier 210. The reflective layer R is adapted for reflecting a light generated by the LED chip 230 so as to increase light utilization. For instance, a material of the first thermal-conductive material layer 224 is copper, a material of the second thermal-conductive material layer 226 is nickel, and a material of the reflective layer R is sliver. In addition, this embodiment does not limit the number of the thermal-conductive material layers contained in the first protrusion 220. Therefore, the first protrusion 220 may comprise a thermal-conductive material layer or a plurality of thermal-conductive material layers.

Figure 9:
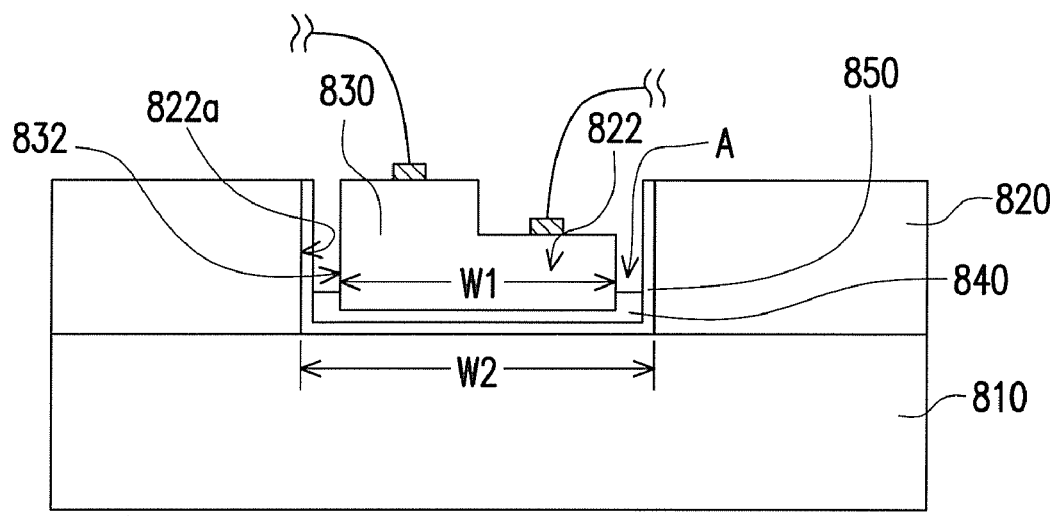
FIG. 9 is a schematic cross-sectional view depicting a light emitting diode package structure according to an embodiment.

FIG. 9 is a schematic cross-sectional view depicting a light emitting diode package structure according to an embodiment of the present invention. Referring to FIG. 9, in this embodiment, a light emitting diode package structure 800 comprises a carrier 810, a first protrusion 820, a LED chip 830, and an adhesion layer 840. The first protrusion 820 is disposed on the carrier 810 and has a first opening 822 to expose the carrier 810. The first protrusion 820 is formed by a thermal conductive material. The LED chip 830 is disposed in the first opening 822 on the carrier 810. Moreover, a ratio between a width W2 of the first opening 822 and a width W1 of the LED chip 830 is larger than 1 and smaller than or equal to 1.5. Therefore, a gap A exists between a sidewall 832 of the LED chip 830 and an inner sidewall 822a of the first opening 822. The adhesion layer 840 is arranged between the LED chip 830 and the carrier 810 to bond the LED chip 830 to the carrier 810.

In this embodiment, the first protrusion 820 and the carrier 810 are, for example, formed in one piece. The first protrusion 820 and the carrier 810 may be formed by the same material (e.g. a thermal conductive material). Because the first protrusion 820 and the carrier 810 are formed in one piece and formed by the same material, heat generated by the LED chip 830 is rapidly transferred to the carrier 810 through the first protrusion 820. Consequently, the light emitting diode package structure 800 has better heat dissipation.

Furthermore, in this embodiment, a portion of the adhesion layer 840 may be disposed in the gap A depending on requirements. Hence, the adhesion layer 840 not only bonds the LED chip 830 to the carrier 810 but also bonds the LED chip 830 to the first protrusion 820. As a consequence, the LED chip 830 and the first protrusion 820 are steadily bonded. In addition, the heat generated by the LED chip 830 is transferred to the first protrusion 820 through the adhesion layer 840.

Depending on requirements, the light emitting diode package structure 800 may further comprise a first optical material layer 850 disposed on the inner wall 822a of the first opening 822 and on the carrier 810 exposed by the first opening 822. The first optical material layer 850 may be a reflective layer or a light absorption layer. If the first optical material layer 850 is a reflective layer, the reflective layer is adapted for reflecting a light, which is emitted from the LED chip 830 to the inner wall 822a of the first opening 822 and the carrier 810 exposed by the first opening 822, so as to enhance light utilization. If the first optical material layer 850 is a light absorption layer, the light absorption layer is adapted for absorbing a light, which is emitted from the LED chip 830 to the inner wall 822a of the first opening 822 and the carrier 810 exposed by the first opening 822, so as to unify a direction of the light emitted by the light emitting diode package structure 800. A variety of the light emitting diode package structure 800 is described as follows.

Figure 10:
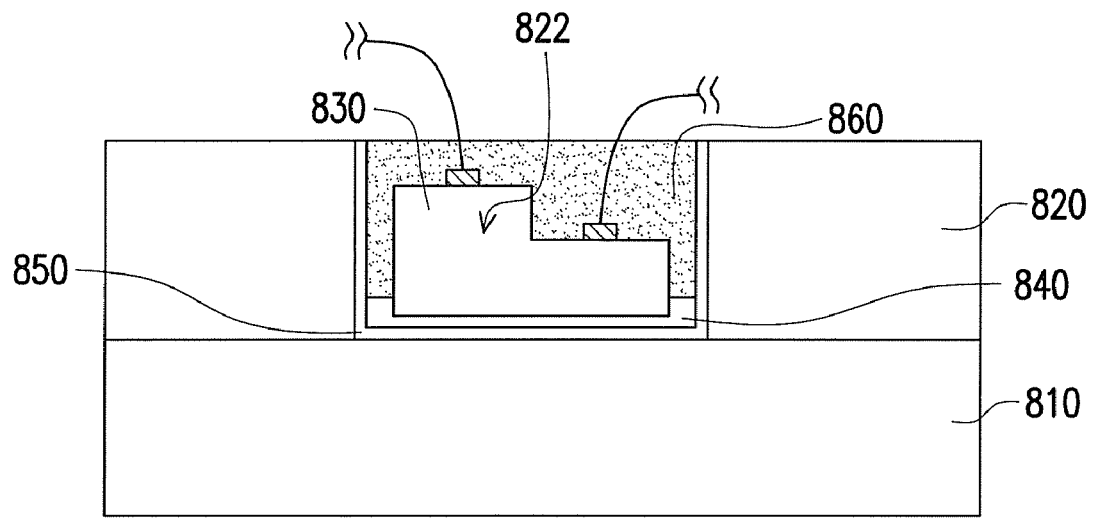
FIG. 10 is a schematic cross-sectional view depicting a light emitting diode package structure according to another embodiment.

FIG. 10 is a schematic cross-sectional view depicting a light emitting diode package structure according to another embodiment of the present invention. Referring to FIG. 10, a light emitting diode package structure 900 may further comprise a first fluorescent material layer 860 disposed in the first opening 822 depending on requirements. Moreover, in other embodiments, the light emitting diode package structure further comprises a transparent material layer disposed in the first opening of the first protrusion.

Figure 11:
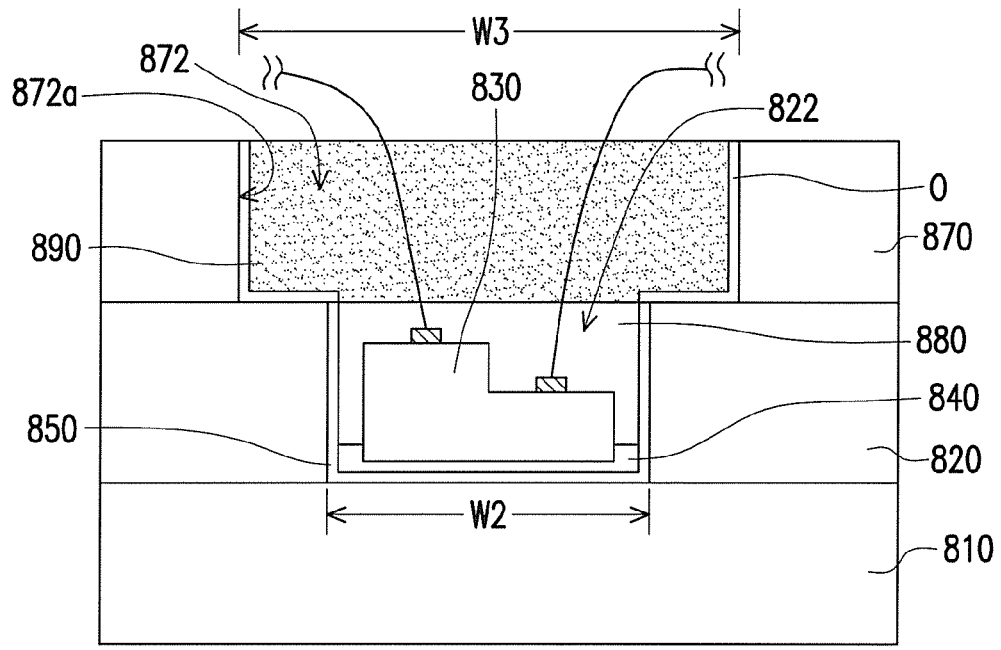
FIG. 11 is a schematic cross-sectional view depicting a light emitting diode package structure according to yet another embodiment.

FIG. 11 is a schematic cross-sectional view depicting a light emitting diode package structure according to yet another embodiment of the present invention. Referring to FIG. 11, a light emitting diode package structure 1000 may further comprise a second protrusion 870 disposed on the first protrusion 820. The second protrusion 870 has a second opening 872, and the second opening 872 is connected with the first opening 822. A width W3 of the second opening 872 is larger than a width W2 of the first opening 822. In this embodiment, it is noted that the width W2 of the first opening 822 and the width W3 of the second opening 872 are referred in the same cross-section.

In this embodiment, the carrier 810, the first protrusion 820, and the second protrusion 870 may be formed in one piece and formed by the same material. In addition, the light emitting diode package structure 1000 may further comprise a second fluorescent material layer 890 disposed in the second opening 872. The second fluorescent material layer 890 has a uniform thickness, and therefore the light emitting diode package structure 1000 emits a light with uniform color.

In this embodiment, the light emitting diode package structure 1000 may further comprise a transparent material layer 880 disposed in the first opening 822. Herein, the transparent material layer 880 is formed by a suitable transparent material, such as epoxy resin or silicon resin. The light emitting diode package structure 1000 may further comprise a second optical material layer O disposed on an inner wall 872a of the second opening 872. The second optical material layer O may be a reflective layer or a light absorption layer. If the second optical material layer O is a reflective layer, the reflective layer is adapted for reflecting a light emitted from the LED chip 830 to the inner wall 872a of the second opening 872, so as to enhance light utilization. If the second optical material layer O is a light absorption layer, the light absorption layer is adapted for absorbing a light emitted from the LED chip 830 to the inner wall 872a of the second opening 872, so as to unify a direction of the light emitted by the light emitting diode package structure 1000.

Figure 12:
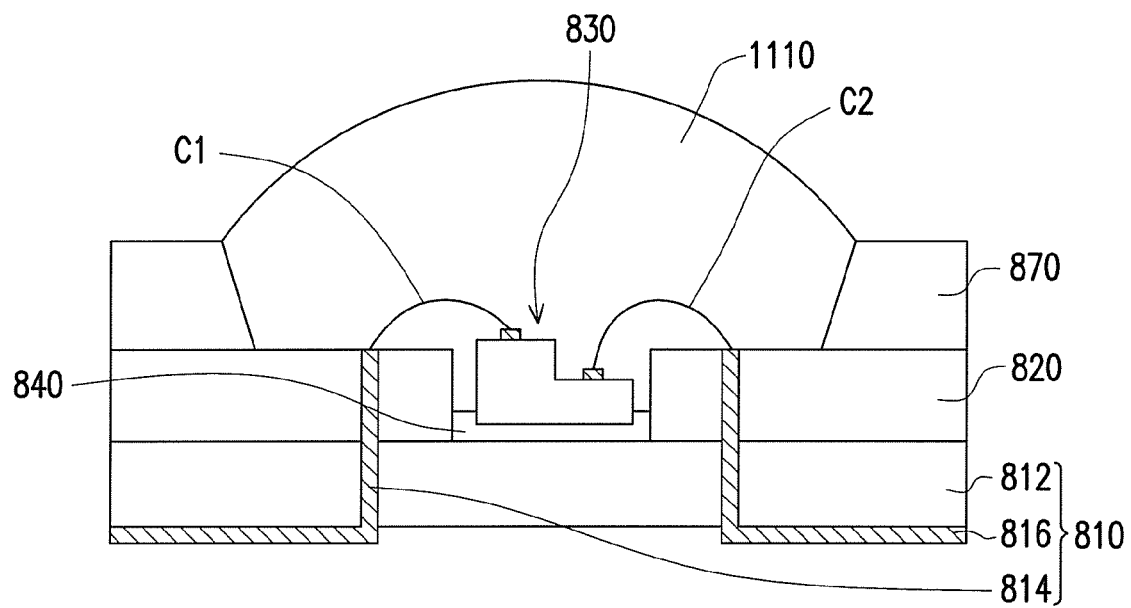
FIG. 12 is a schematic cross-sectional view depicting a variety of the light emitting diode package structure in FIG. 11.

FIG. 12 is a schematic cross-sectional view depicting a variety of the light emitting diode package structure in FIG. 11. Referring to FIG. 12, a light emitting diode package structure 1100 in this embodiment is similar to the light emitting diode package structure 1000 in FIG. 11. The difference lies in that the carrier 810 in this embodiment comprises the substrate 812, the first conductive structure 814, and the second conductive structure 816. Furthermore, the first conductive structure 814 and the second conductive structure 816 respectively pass through the substrate 812 and the first protrusion 820. In this embodiment, the substrate 812 and the first protrusion 820 are formed by an insulating material. The LED chip 830 is electrically connected with the first conductive structure 814 and the second conductive structure 816 respectively through the first conductive line C1 and the second conductive line C2.

FIGS. 13A~13D are schematic cross-sectional views depicting a process flow for fabricating a light emitting diode package structure according to an embodiment of the present invention. First, referring to FIG. 13A, a carrier 1310 having a first surface 1312 is provided. In the meantime, a surface treatment process may be performed on the first surface 1312 of the carrier 1310. The surface treatment process is, for example, adapted for forming a first thermal-conductive material layer on the first surface 1312 or increasing adhesion between the first thermal-conductive material layer and the carrier 1310.

Figure 13A:
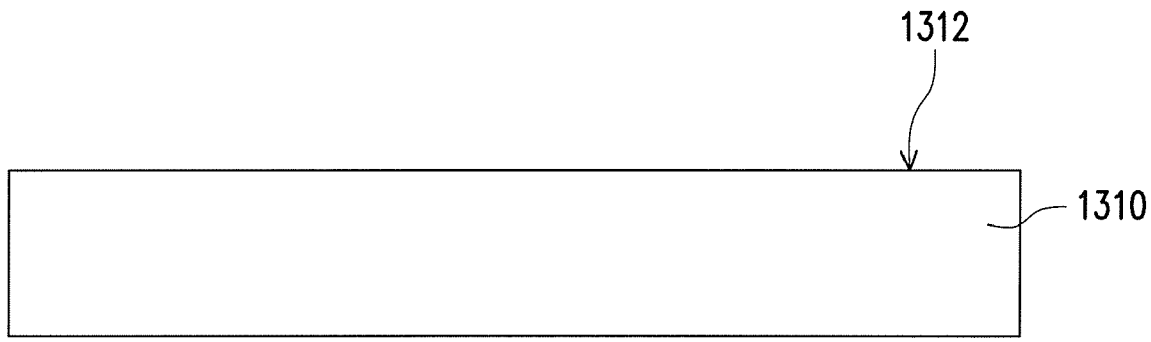
FIGS. 13A~13D are schematic cross-sectional views depicting a process flow for fabricating a light emitting diode package structure according to an embodiment.
Figure 13B:
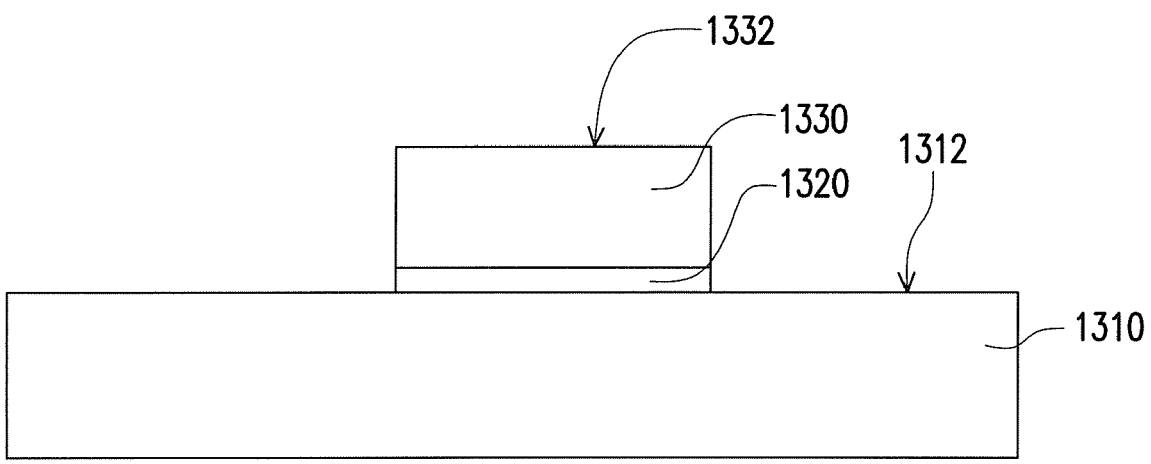

Then, referring to FIG. 13B, an adhesion layer 1320 and a LED chip 1330 are disposed on the first surface 1312 of the carrier 1310. Herein, the adhesion layer 1320 is bonded between the LED chip 1330 and the carrier 1310, and the LED chip 1330 has a second surface 1332 away from the carrier 1310.

Figure 13C:
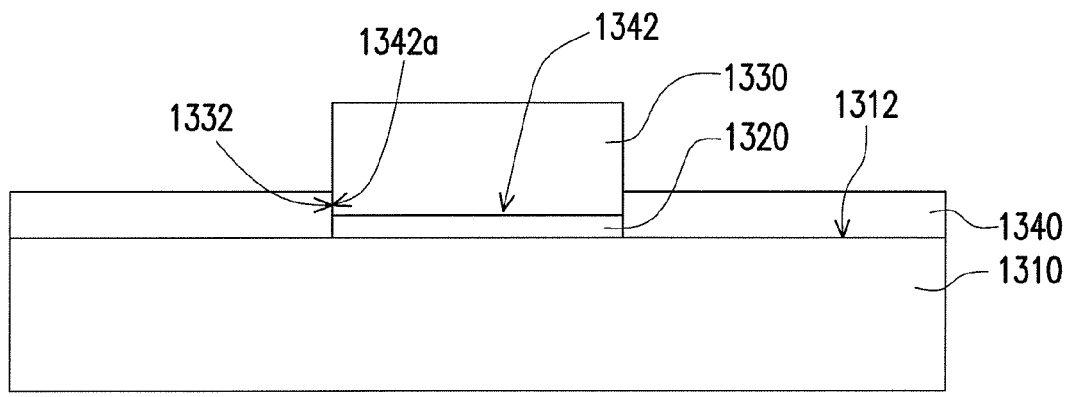

Thereafter, referring, to FIG. 13C, a first thermal-conductive material layer 1340 is formed on the first surface 1312. The first thermal-conductive material layer 1340 has a first opening 1342 to expose the LED chip 1330, and an inner sidewall 1342a of the first opening 1342 is attached to a sidewall 1332 of the LED chip 1330. In this embodiment, a method for forming the first thermal-conductive material layer 1340 comprises electroless plating, electroplating, electrophoresis, electrodeposition, or a combination of the above. Moreover, in other embodiments not illustrated here, a method for forming the first thermal-conductive material layer further comprises disposing a bonding layer and a thermal conductive element on the first surface of the carrier, wherein the bonding layer is bonded between the carrier and the thermal conductive element.

Figure 13D:
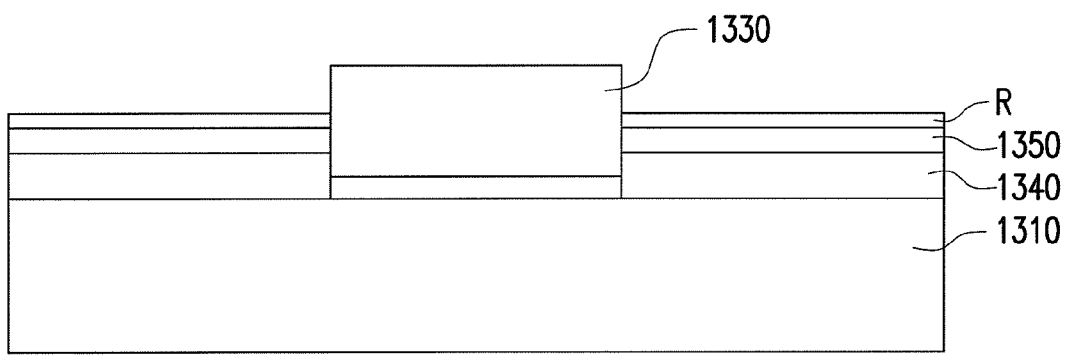

In this embodiment, referring to FIG. 13D, a second thermal-conductive material layer 1350 is formed on the first thermal-conductive material layer 1340 after the first thermal-conductive material layer 1340 is formed. Furthermore, in this embodiment, a reflective layer R may be formed on the second thermal-conductive material layer 1350 after the second thermal-conductive material layer 1350 is formed. Herein, a material of the first thermal-conductive material layer 1340 is copper, a material of the second thermal-conductive material layer 1350 is nickel, and a material of the reflective layer R is sliver.

Figure 14A:
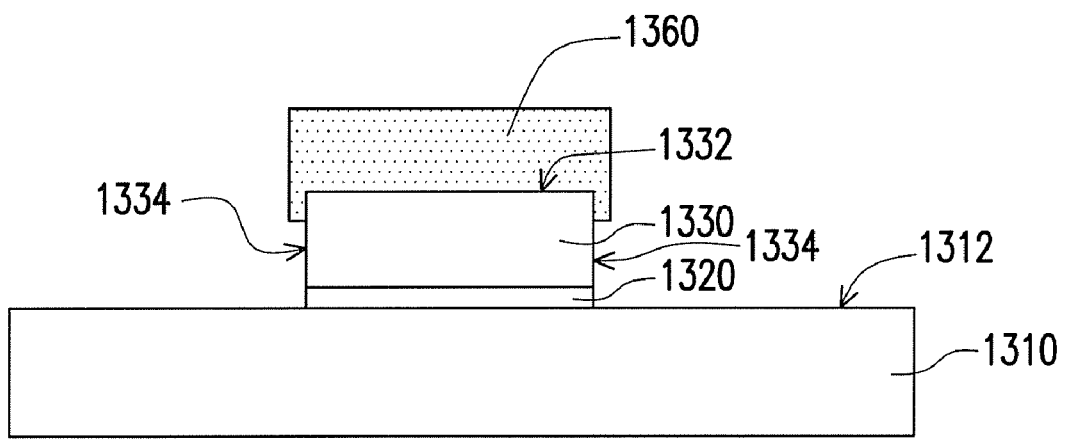
FIGS. 14A~14C are schematic cross-sectional views depicting a process flow for fabricating a light emitting diode package structure according to another embodiment.
Figure 14B:
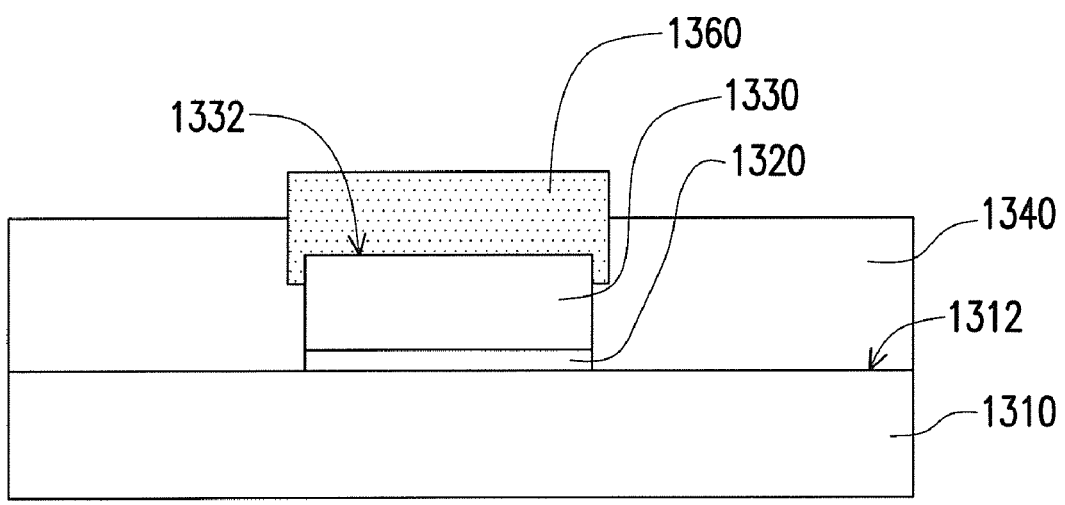
Figure 14C:
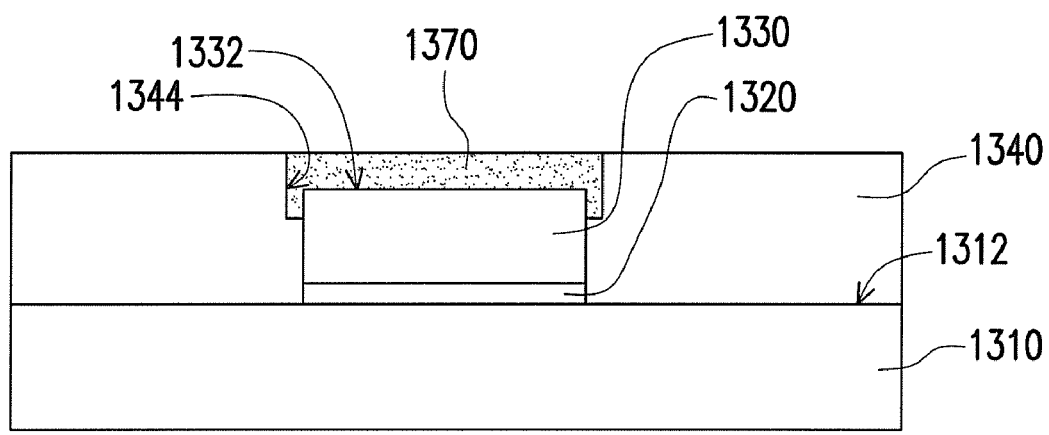

FIGS. 14A~14C are schematic cross-sectional views depicting a process flow for fabricating a light emitting diode package structure according to another embodiment of the present invention. The fabricating process flow in this embodiment is similar to the fabricating process flow illustrated in FIGS. 13A~13D.

Referring to FIG. 14A, the difference lies in that this embodiment further comprises forming a shielding layer 1360 on the second surface 1332 and on a portion of the sidewall 1334 of the LED chip 1330, before forming the first thermal-conductive material layer and after disposing the adhesion layer 1320 and the LED chip 1330 on the first surface 1312 of the carrier 1310. Then, referring to FIG. 14B, the first thermal-conductive material layer 1340 is formed on the first surface 1312. Thereafter, referring to FIG. 14C, the shielding layer 1360 is removed. A recess 1344 is formed in the first thermal-conductive material layer 1340 after removing the shielding layer 1360 and a fluorescent material layer 1370 is formed in the recess 1344.

Figure 15A:
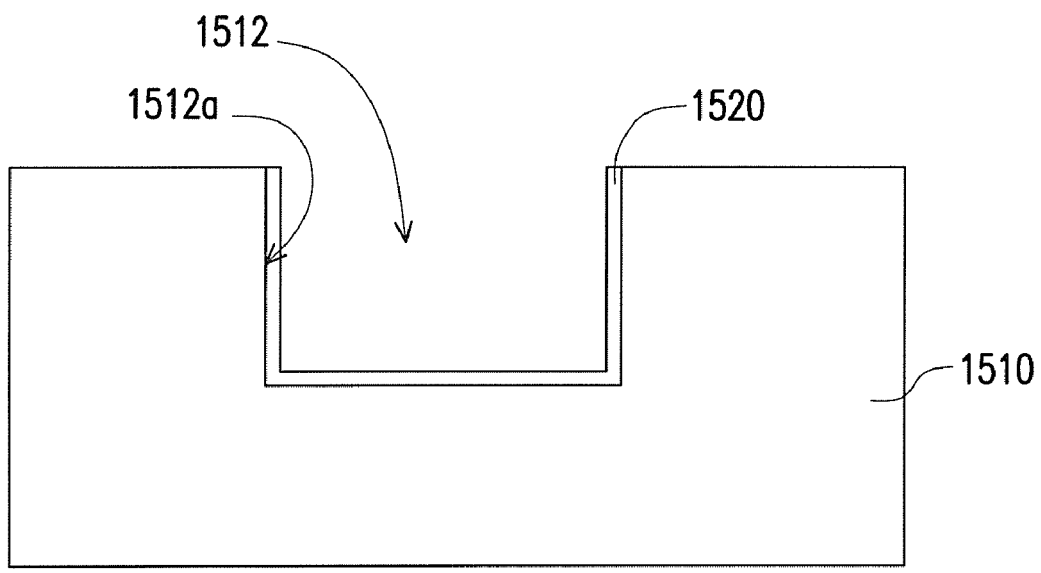
FIGS. 15A~15C are schematic cross-sectional views depicting a process flow for fabricating a light emitting diode package structure according to an embodiment.
Figure 15B:
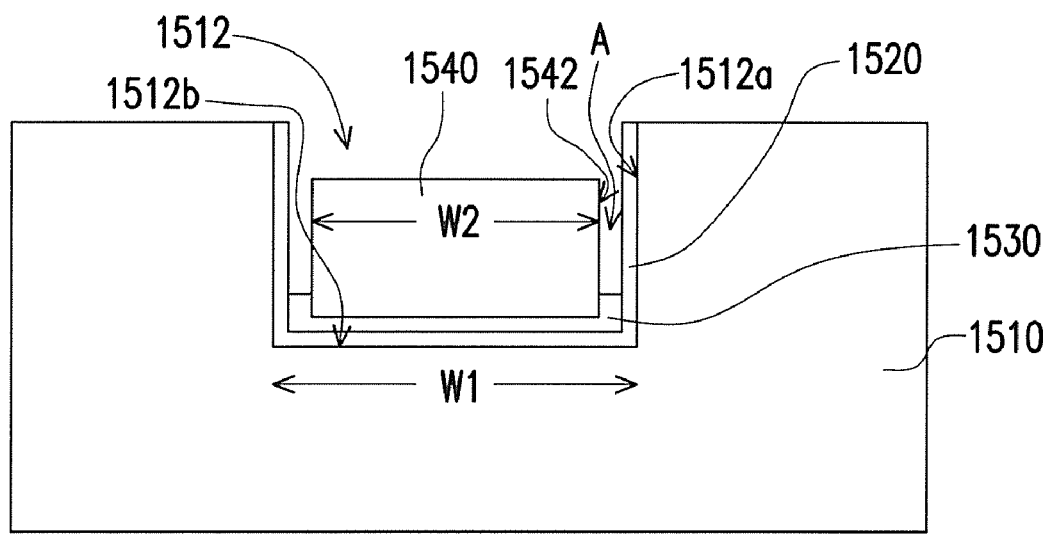
Figure 15C:
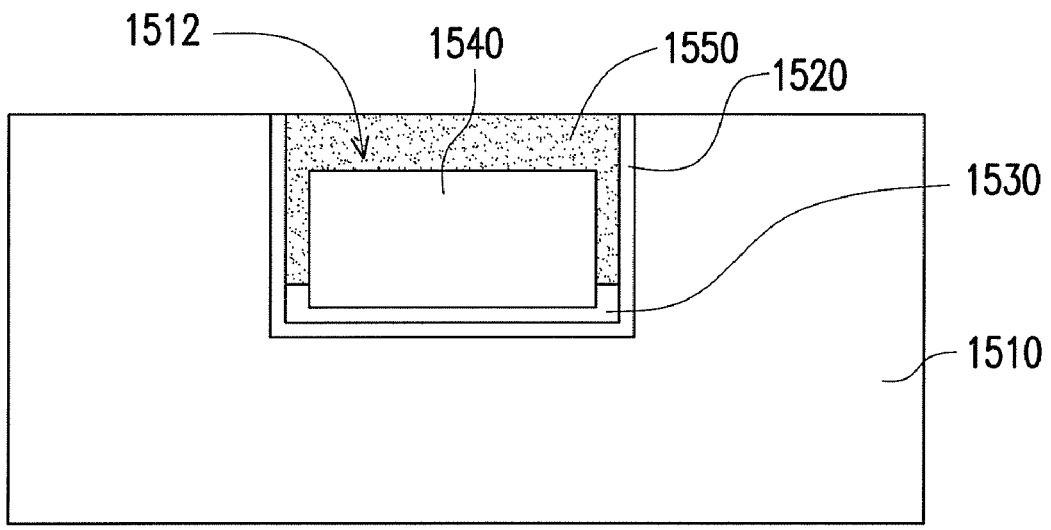

FIGS. 15A~15C are schematic cross-sectional views depicting a process flow for fabricating a light emitting diode package structure according to an embodiment of the present invention. First, referring to FIG. 15A, a carrier 1510 having a recess 1512 is provided. In this embodiment, an optical material layer 1520 may also be formed on an inner wall 1512a of the recess 1512. The optical material layer 1520 is, for example, a reflective layer, a light absorption layer, or other suitable optical material layers.

Then, referring to FIG. 15B, the adhesion layer 1530 and the LED chip 1540 are disposed on a bottom 1512b of the recess 1512, and the adhesion layer 1530 is bonded between the carrier 1510 and the LED chip 1540. A ratio between a width W1 of the recess 1512 and a width W2 of the LED chip 1540 is larger than 1 and smaller than or equal to 1.5 such that a gap A exists between a sidewall 1542 of the LED chip 1540 and the inner wall 1512a of the recess 1512. Further referring to FIG. 15C, in this embodiment, a fluorescent material layer 1550 may be formed in the recess 1512.

Figure 16:
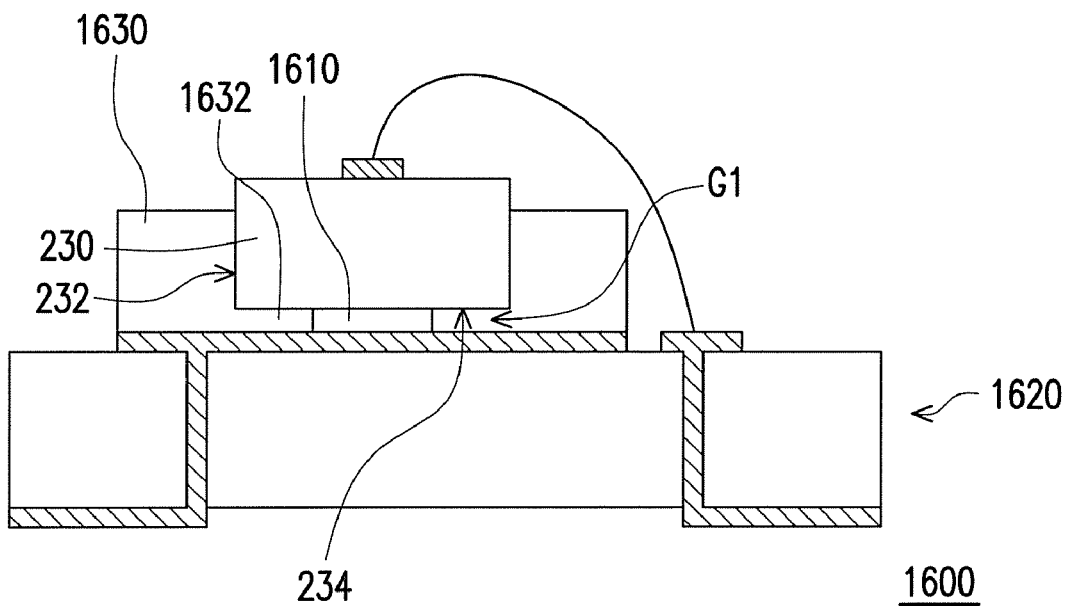
FIG. 16 is schematic cross-sectional views depicting a light emitting diode package structure according to an embodiment.
Figure 17:
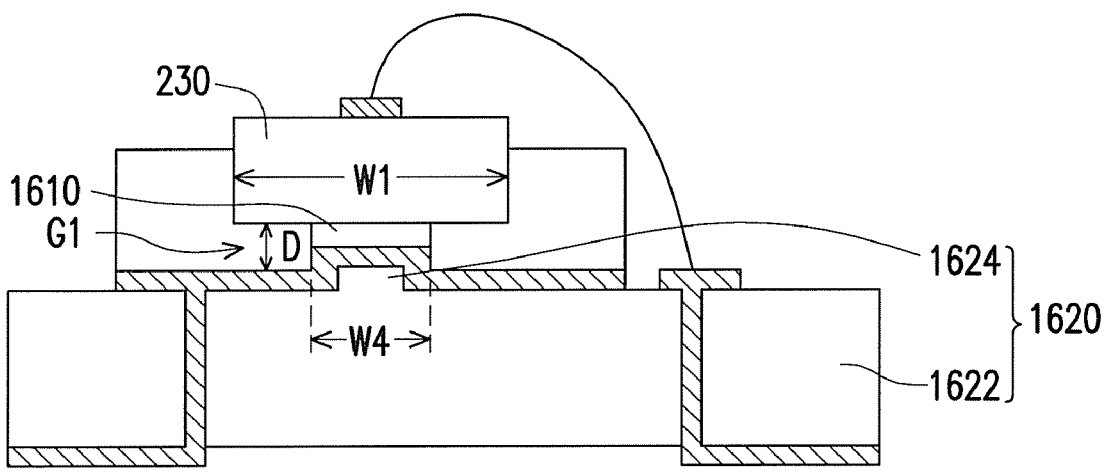
FIG. 17 and FIG. 18 are two variations of the light emitting diode package structure in FIG. 16.
Figure 18:
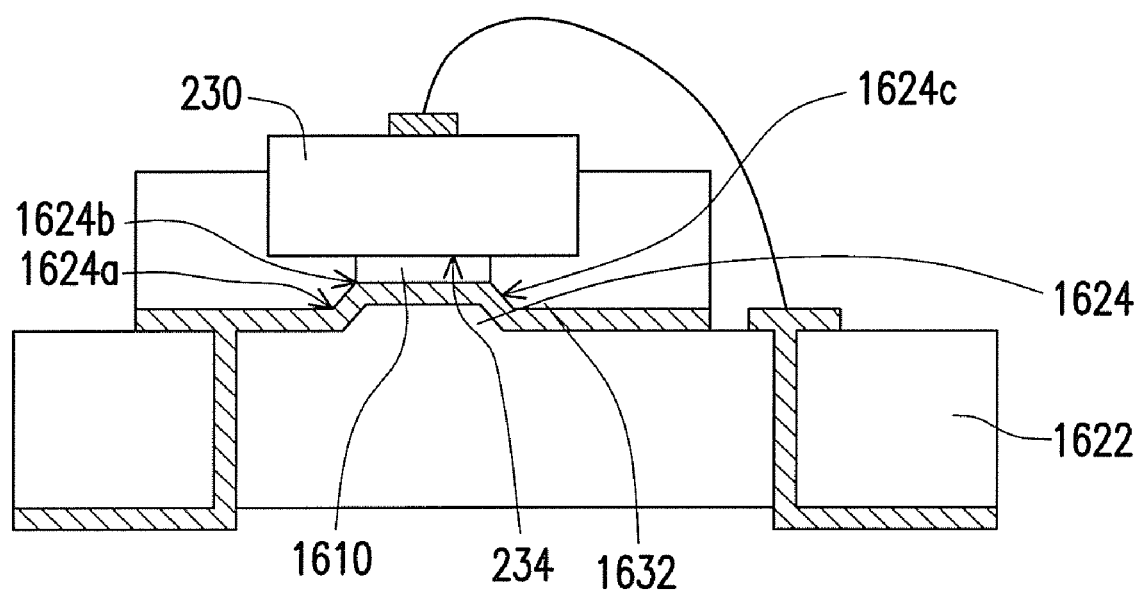

FIG. 16 is schematic cross-sectional views depicting a light emitting diode package structure according to an embodiment. FIG. 17 and FIG. 18 are two variations of the light emitting diode package structure in FIG. 6. Referring to FIG. 16, in this embodiment, a light emitting diode package structure 1600 is similar to the light emitting diode package structure 200 in FIG. 2. The difference between the light emitting diode package structures 1600 and 200 is that a projection area of an adhesion layer 1610 of the light emitting diode package structures 1600 to a carrier 1620 is smaller than a projection area of the LED chip 230 to the carrier 1620 and there is a gap G1 between the LED chip 230 and the carrier 1620. The first protrusion 1630 has an extending portion 1632 filled the gap G1. In this embodiment, the extending portion 1632 contacts a bottom 234 of the LED chip 230.

It should be noted that the first protrusion 1630 is conducive to enhancing thermal conduction efficiency of the bottom 234 of the LED chip 230 besides enhancing thermal conduction efficiency of the sidewall 232 of the LED chip 230 because the extending portion 1632 of the first protrusion 1630 is filled in the gap G1. Further, the heat generated by the light emitting layer of the LED chip 230, during light emitting, is removed more quickly.

Referring to FIG. 17, the carrier 1620 has a pedestal 1624 protruding from a main body 1622 of the carrier 1620 and the LED chip 230 is disposed on the pedestal 1624 for increasing the distance D between the LED chip 230 and the main body 1622 of the carrier 1620. The width W4 of the pedestal 1624 is smaller than the width W1 of LED chip 230 and an adhesion layer 1610 is disposed between the pedestal 1624 and the LED chip 230.

Referring to FIG. 18, for increasing the contact area between the bottom 234 of the LED chip 230 and the extending portion 1632, the pedestal 1624 has a first end 1624a and a second end 1624b wherein the first end 1624a connects the main body 1622 and the second end 1624b extends toward the LED chip 230 and the width of the pedestal 1624 is gradually decreased along a direction from the first end 1624a to the second end 1624b. The pedestal 1624 has a sidewall 1624c connecting the first end 1624a and the second end 1624b wherein the sidewall 1624c is an inclined plane and the pedestal 1624 is a tapering structure, for example.

It can be learned from the above that, in this embodiment, the contact area between the adhesion layer 1610 and LED chip 230 is decreased by decreasing the area of the second end 1624b of the pedestal 1624 for increasing the contact area between the LED chip 230 and the extending portion 1632, which enhances thermal conduction efficiency of the bottom 234 of the LED chip 230.

Figure 30B:
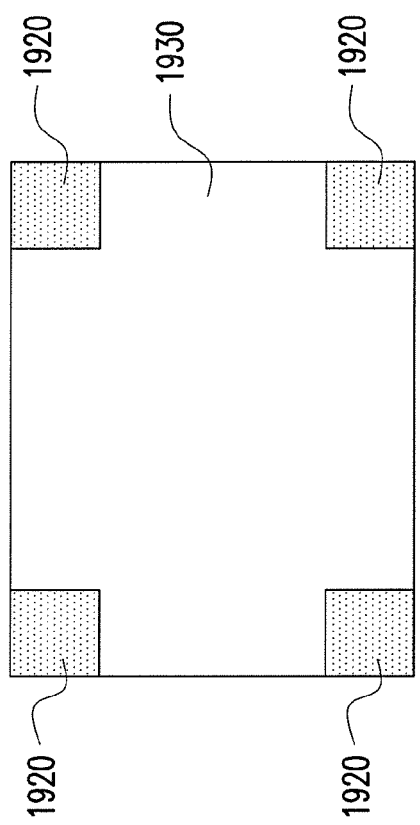
FIG. 30A is a schematic cross-sectional view depicting a LED package structure according to an embodiment and FIG. 30B is a schematic top view depicting the LED chip in FIG. 30A.
Figure 30A:
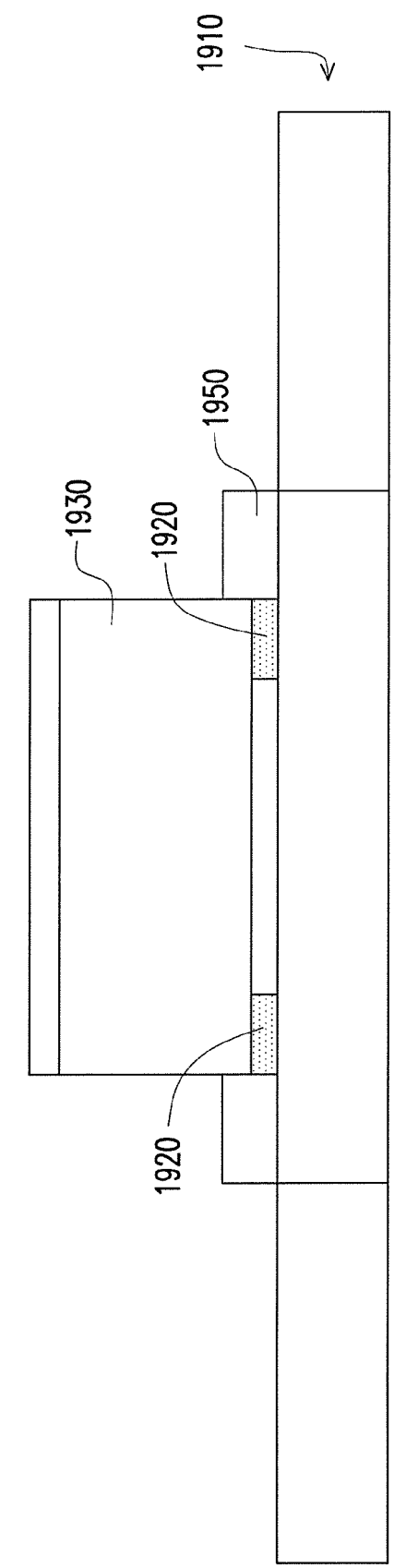

FIGS. 19A~19D are schematic cross-sectional views depicting a process flow for fabricating a light emitting diode package structure according to an embodiment. FIG. 20 is a schematic cross-sectional view depicting a LED package structure according to an embodiment of the present invention. The process of FIGS. 19A~19D is one of the fabrication methods of the LED package structure 1600 in FIG. 16. FIG. 29A is a schematic cross-sectional view depicting a LED package structure according to an embodiment and FIG. 29B is a schematic top view depicting the LED chip in FIG. 29A. FIG. 30A is a schematic cross-sectional view depicting a LED package structure according to an embodiment and FIG. 30B is a schematic top view depicting the LED chip in FIG. 30A.

Figure 19A:
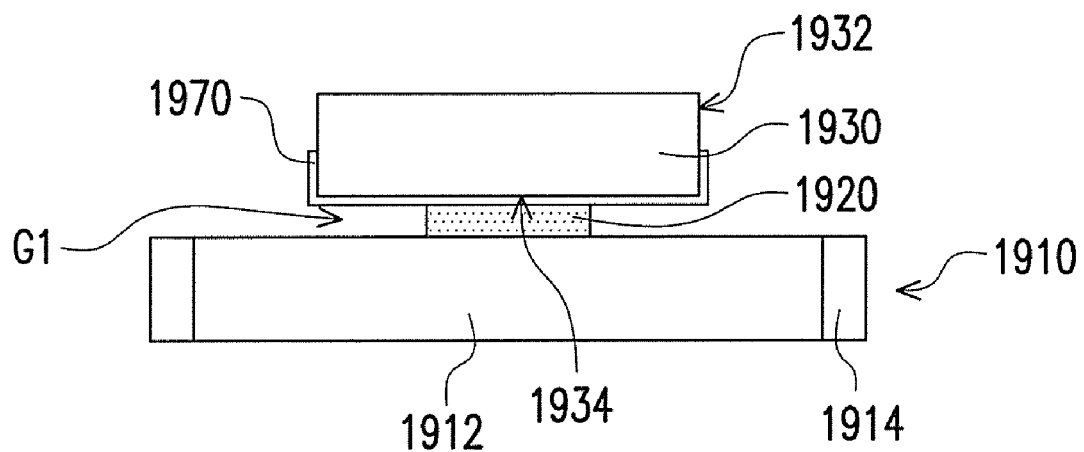
FIGS. 19A~19D are schematic cross-sectional views depicting a process flow for fabricating a light emitting diode package structure according to an embodiment.
Figure 20:
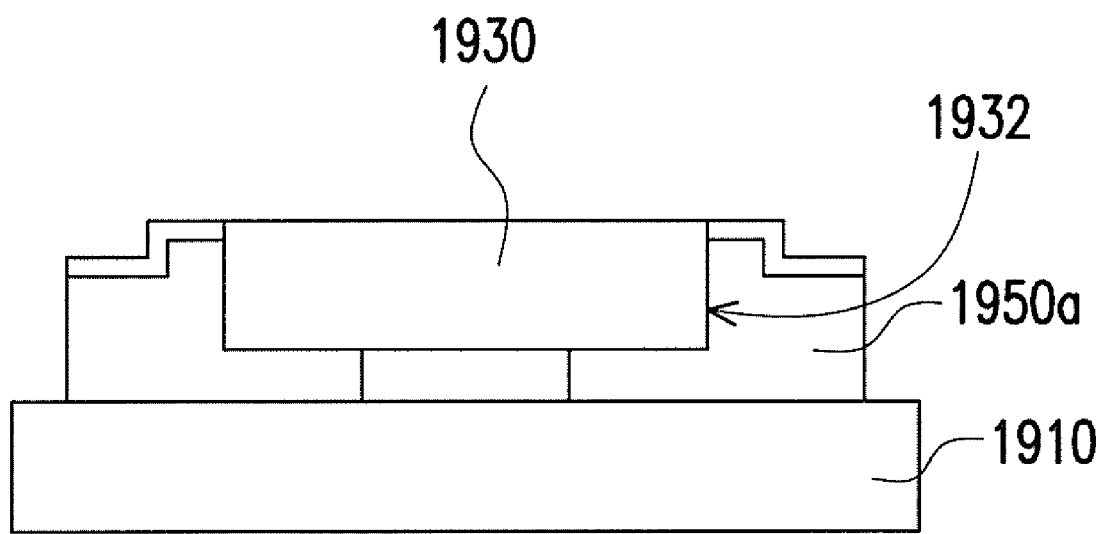
FIG. 20 is a schematic cross-sectional view depicting a LED package structure according to an embodiment.

Firstly, referring to FIG. 19A, a carrier 1910, an adhesion layer 1920 and a LED chip 1930 are provided wherein the adhesion layer 1920 is disposed on the carrier 1910 and connects the LED chip 1930 to the carrier 1910. In this embodiment, the projection area of the adhesion layer 1920 to the carrier 1910 is smaller than the projection area of the LED chip 1930 to the carrier 1910 and there is a gap G1 between the LED chip 1930 and the carrier 1910. The carrier 1910 has a center portion 1912 and a periphery portion 1914 around the center portion 1912. The material of the center portion 1912 includes copper. The materials of the periphery portion 1914 include insulating material or plastic material. A metal layer 1970 is optionally disposed on the bottom 1934 and the sidewall 1932 of the LED chip 1930.

Figure 19B:
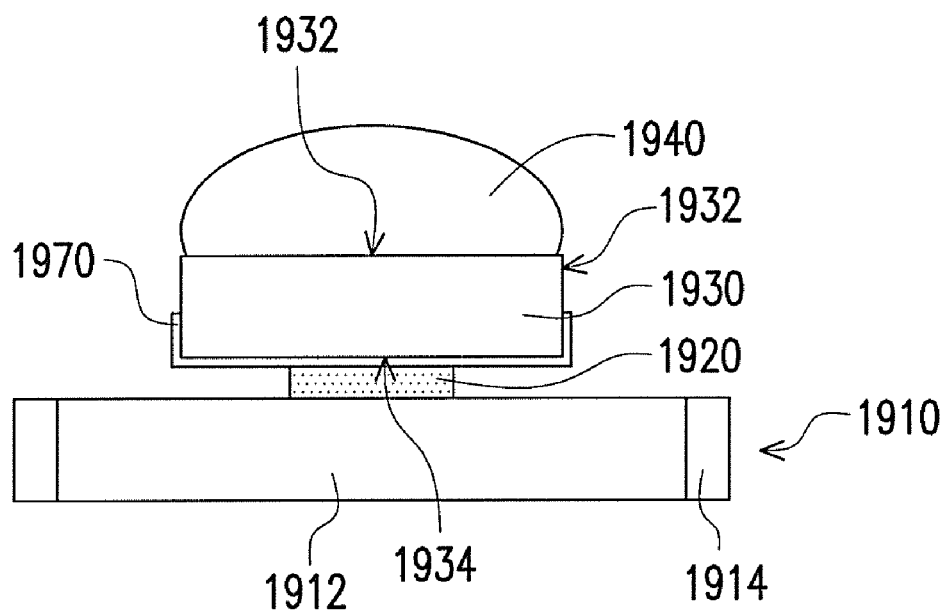
Figure 19C:
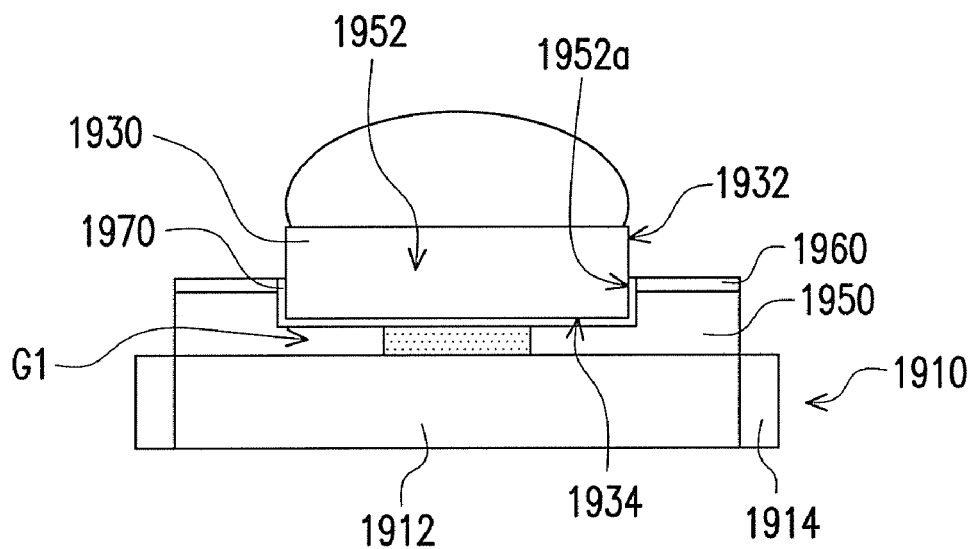

Then, referring to FIG. 19B, a shield layer 1940 is formed on the LED chip 1930 and covers a surface 1932 of the LED chip 1930 facing away from the carrier 1910. After that, referring to FIG. 19C, a first thermal-conductive material layer 1950 is formed on the carrier 1910. The first thermal-conductive material layer 1950 has a first opening 1952 exposing the LED chip 1930 and the insidewall 1952a of the first opening 1952 contacts the metal layer 1970. It should be note that, in this embodiment, the first thermal-conductive material layer 1950 is filled in the gap G1. This is to say, the first thermal-conductive material layer 1950 connects the bottom 1934 of the LED chip 1930. Then, a reflective layer 1960 is formed on the first thermal-conductive material layer 1950 optionally. In this embodiment, the first thermal-conductive material layer 1950 is thinner than the LED chip 1930 so as to help the LED chip 1930 emit light from the sidewall 1932.

Figure 19D:
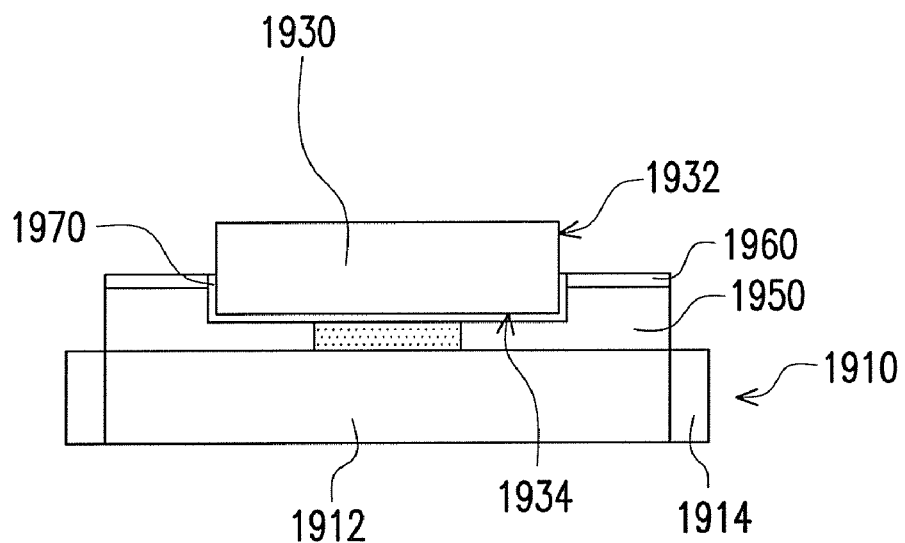

Referring to FIG. 19D, the shield layer 1940 is removed for exposing the LED chip 1930. Besides, in this embodiment, the first thermal-conductive material layer 1950 partially covers the sidewall 1932 of the LED chip 1930. Relatively speaking, in other embodiment, referring to FIG. 20, the first thermal-conductive material layer 1950 may optionally covers the sidewall 1932 of the LED chip 1930 entirely. Referring to FIG. 29A and FIG. 29B, in another embodiment, a light emitting diode package structure 2900 has a plurality of adhesion layers 1920 and some of the adhesion layers 1920 are disposed at the corners of the LED chip 1930 and one of the adhesion layers 1920 is disposed at the edge of the LED chip 1930. Referring to FIG. 30A and FIG. 30B, in another embodiment, all of the adhesion layers 1920 are disposed at four corners of the LED chip 1930.

Figure 21A:
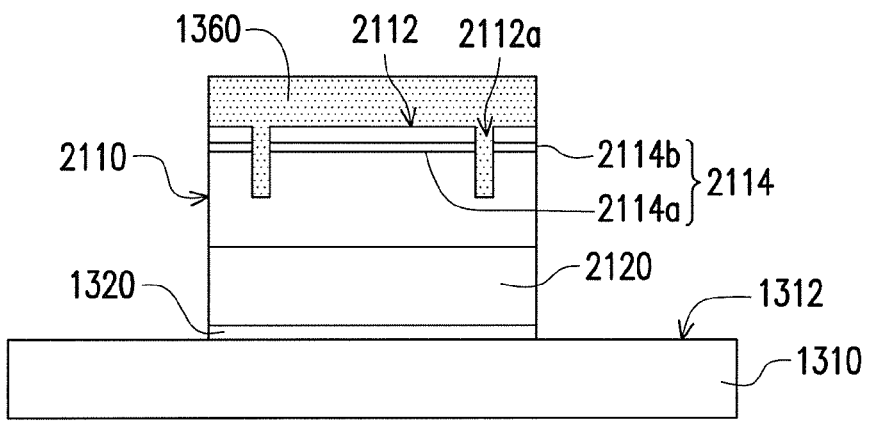
FIGS. 21A~21C are schematic cross-sectional views depicting a process flow for fabricating a light emitting diode package structure according to another embodiment.
Figure 21B:
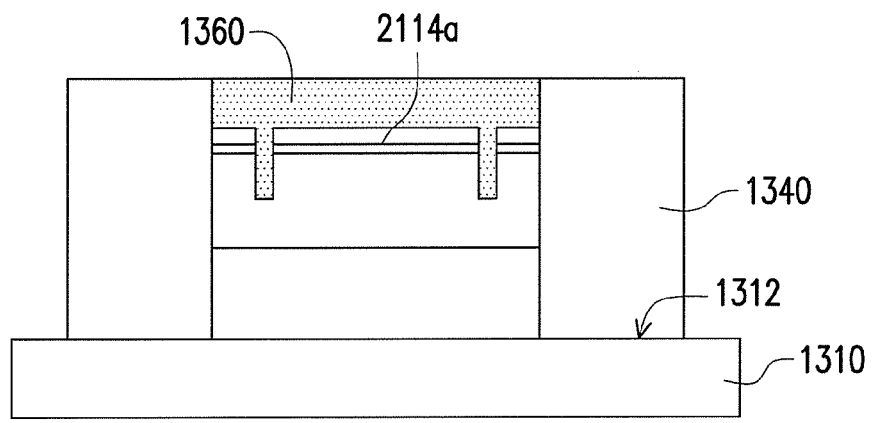
Figure 21C:
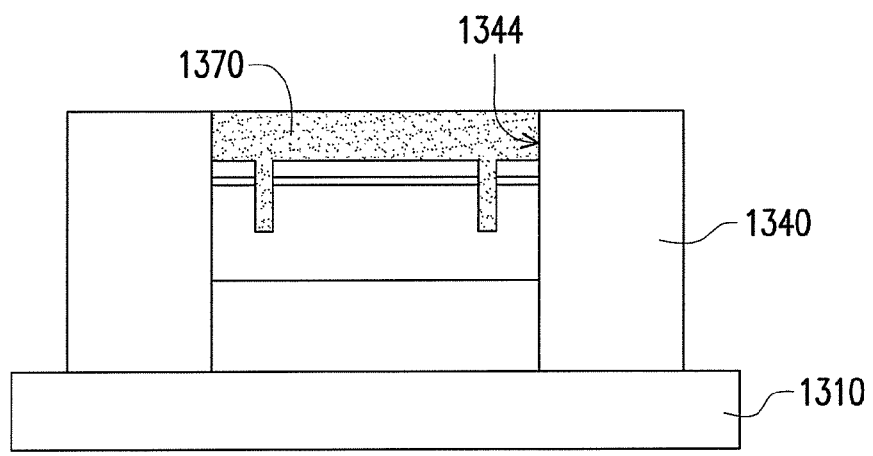

FIGS. 21A~21C are schematic cross-sectional views depicting a process flow for fabricating a light emitting diode package structure according to another embodiment.

The fabricating process flow in this embodiment is similar to the fabricating process flow illustrated in FIGS. 14A~14C. Referring to FIG. 21A, the difference lies in that a LED chip 2110 of this embodiment is different from the LED chip 1330 illustrated in FIGS. 14A~14C wherein the LED chip 2110 has a surface 2112 facing away from the carrier 1310 and the surface 2112 has a trench 2112a passing through a light emitting layer 2114 of the LED chip 2110. The trench 2112a divides the light emitting layer 2114 into a center part 2114a and a peripheral part 2114b. The center part 2114a and the peripheral part 2114b are isolated from each other.

The LED chip 2110 is disposed on a substrate 2120. The substrate 2120 is fixed on a surface 1312 of a carrier 1310 by an adhesion layer 1320 disposed therebetween. In this embodiment, the disposition of the substrate 2120 is optional. In other words, the LED chip 2110 can be disposed on the carrier 1310 directly. Then, a shielding layer 1360 is formed on the surface 2112 and filled in the trench 2112a.

Then, referring to FIG. 21B, a first thermal-conductive material layer 1340 is formed on the surface 1312. It should be noted that the center part 2114a and the peripheral part 2114b are isolated from each other so the center part 2114a is isolated from the first thermal-conductive material layer 1340 to prevent short-circuit of the center part 2114a and the first thermal-conductive material layer 1340.

Thereafter, referring to FIG. 21C, the shielding layer 1360 is removed. A recess 1344 is formed in the first thermal-conductive material layer 1340 after removing the shielding layer 1360 and a fluorescent material layer 1370 is formed in the recess 1344.

Figure 22A:
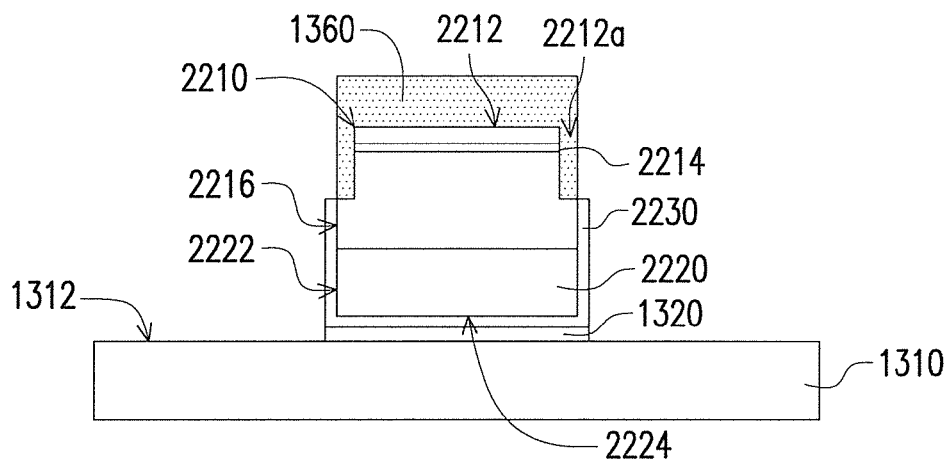
FIGS. 22A~22C are schematic cross-sectional views depicting a process flow for fabricating a light emitting diode package structure according to another embodiment.
Figure 22B:
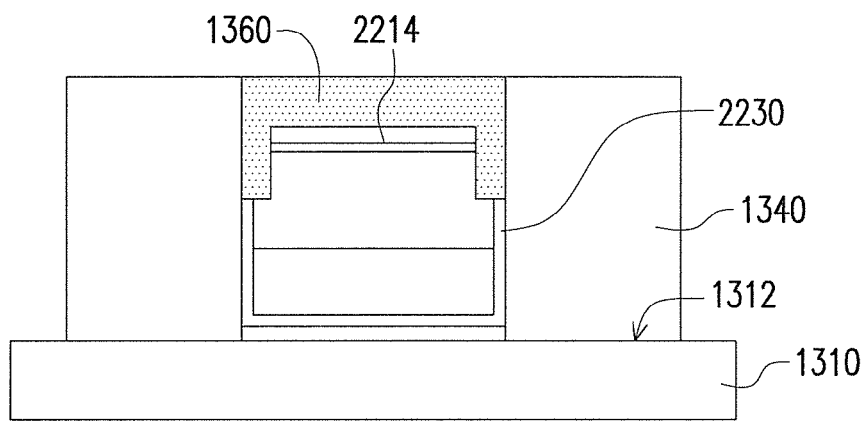
Figure 22C:
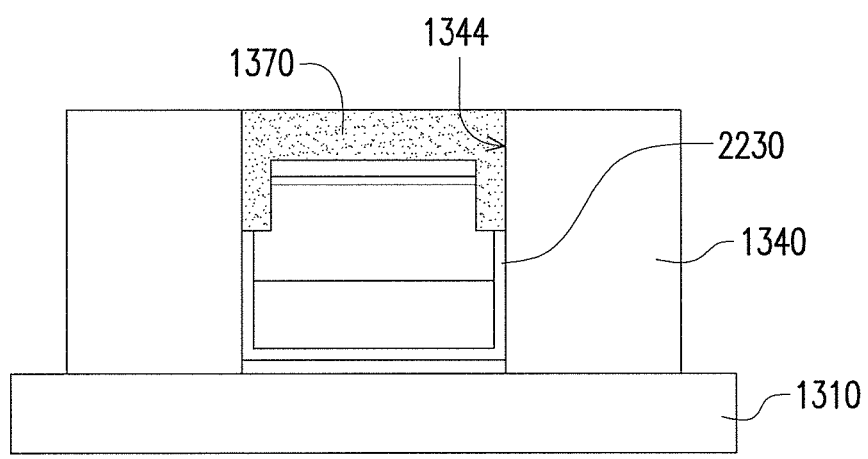

FIGS. 22A~22C are schematic cross-sectional views depicting a process flow for fabricating a light emitting diode package structure according to another embodiment.

The fabricating process flow in this embodiment is similar to the fabricating process flow illustrated in FIGS. 21A~21C. Referring to FIG. 22A, the difference lies in that a LED chip 2210 of this embodiment is different from the LED chip 2120 illustrated in FIGS. 21A~21C wherein the LED chip 2210 has a surface 2212 facing away from the carrier 1310 and the surface 2212 has a trench 2212a passing through a light emitting layer 2214 of the LED chip 2210 and the trench 2212a is located on the edge of the LED chip 2210.

The LED chip 2210 is disposed on a substrate 2220. The substrate 2220 is fixed on a surface 1312 of a carrier 1310 by an adhesion layer 1320 disposed therebetween. In this embodiment, the disposition of the substrate 2220 is optional. In other words, the LED chip 2210 can be disposed on the carrier 1310 directly. Then, a shielding layer 1360 is formed on the surface 2212 and filled in the trench 2212a. A film 2230 is disposed on the side wall 2216 of the LED chip 2210, the side wall 2222 and the bottom 2224 of the substrate 2220 wherein the film 2230 is single or multi-layered and is an adhesion layer, a mirror layer, a barrier layer or a seed layer.

Then, referring to FIG. 22B, a first thermal-conductive material layer 1340 is formed on the surface 1312. It should be noted that the shielding layer 1360 separates the light emitting layer 2214 and the first thermal-conductive material layer 1340 to prevent short-circuit of the light emitting layer 2214 and the first thermal-conductive material layer 1340.

Thereafter, referring to FIG. 22C, the shielding layer 1360 is removed. A recess 1344 is formed in the first thermal-conductive material layer 1340 after removing the shielding layer 1360 and a fluorescent material layer 1370 is formed in the recess 1344.

Figure 23A:
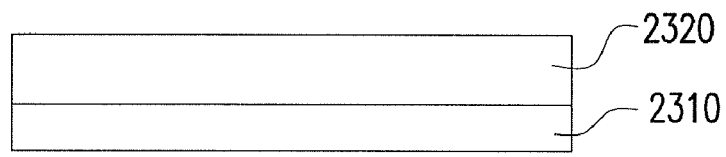
FIGS. 23A~23G are schematic cross-sectional views depicting a process flow for fabricating a light emitting diode package structure according to another embodiment.
Figure 24:
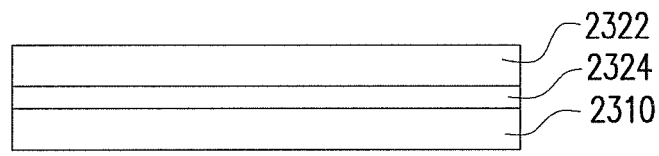
FIG. 24 is schematic cross-sectional view depicting a variation structure of FIG. 23A
Figure 25:
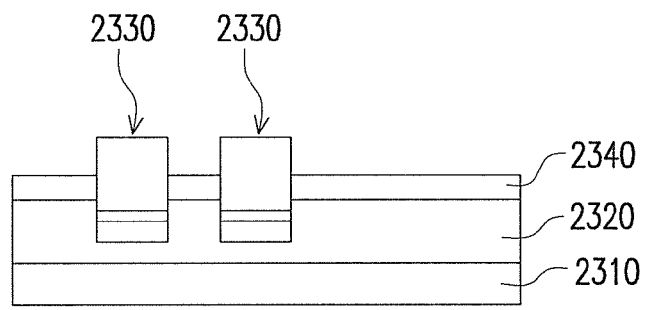
FIG. 25 is schematic cross-sectional view depicting a variation structure of FIG. 23B.

FIGS. 23A~23G are schematic cross-sectional views depicting a process flow for fabricating a light emitting diode package structure according to another embodiment. FIG. 24 is schematic cross-sectional view depicting a variation structure of FIG. 23A and FIG. 25 is schematic cross-sectional view depicting a variation structure of FIG. 23B.

Referring to FIG. 23A, a temporary substrate 2310 is provided. An adhesion layer 2320 is formed on the temporary substrate 2310 wherein the material of the adhesion layer 2320 is a removable material such as a photoresist material. In other embodiment, a plurality of adhesion layers 2322, 2324 are disposed on the temporary substrate 2310 and the adhesion layers 2322, 2324 stack with each other wherein the adhesion layers 2322 is for example, a photoresist layer and the adhesion layers 2324 is for example, an adhesive tape as shown in FIG. 24.

Figure 23B:
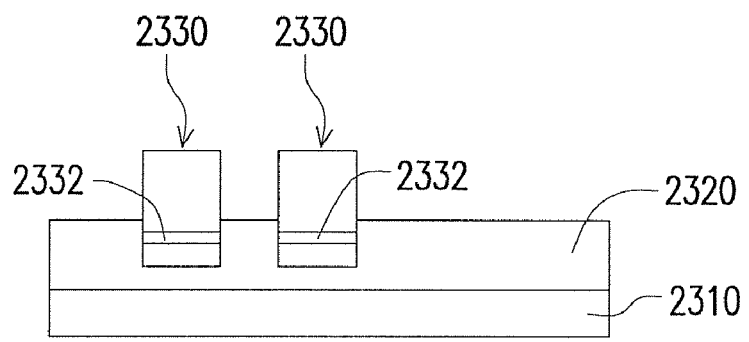

Then, referring, to FIG. 23B, a plurality of LED chips 2330 are disposed on the temporary substrate 2310 wherein the LED chips 2330 are partially embedded in the adhesion layer 2320, respectively. More particularly, the light emitting layers 2332 of the LED chips 2330 are embedded in the adhesion layer 2320. In other embodiment, an adhesion layer 2340 is formed on the adhesion layer 2320 and exposes the LED chips 2330 wherein the material of the adhesion layer 2340 is a removable material such as a photoresist material as shown in FIG. 25.

Figure 23C:
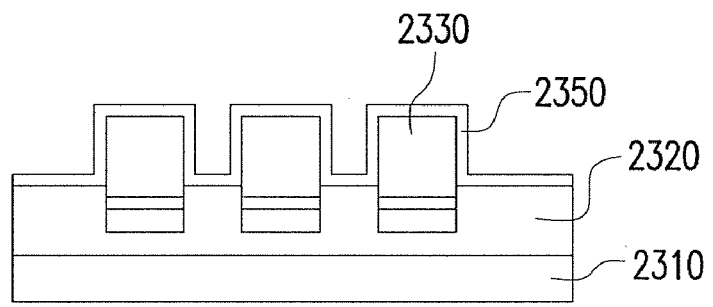

Thereafter, referring to FIG. 23C, a film 2350 is formed on the adhesion layer 2320 and covers the LED chips 2330 fully. The film 2350 is single or multi-layered and the film 2350 is an adhesion layer, a mirror layer, a barrier layer or a seed layer.

Figure 23D:
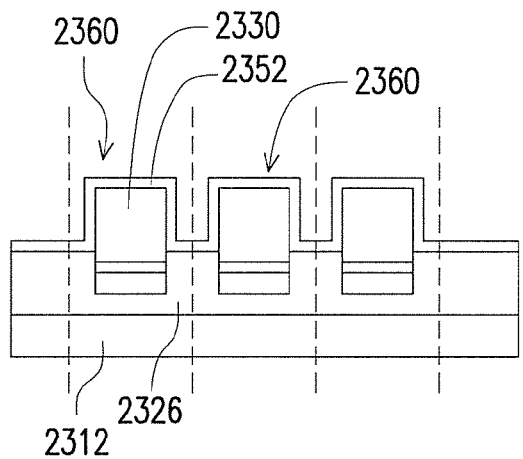

Next, referring to FIG. 23D, the temporary substrate 2310 and the adhesion layer 2320 are singulated into a plurality of LED chip units 2360 and each LED chip unit 2360 has a LED chip 2330, a first film 2352, a first adhesion layer 2326 and a first temporary substrate 2312.

Figure 23E:
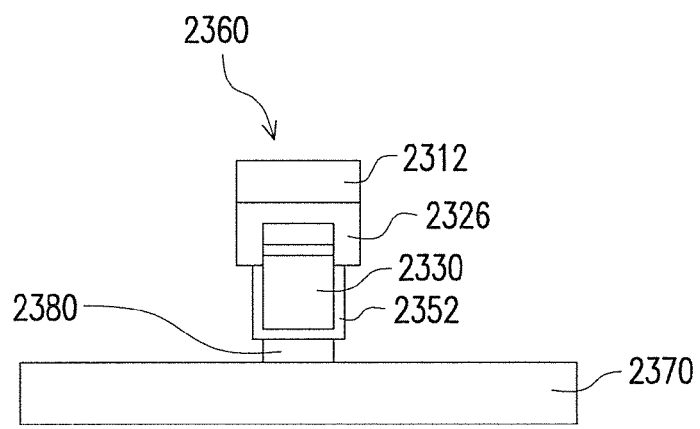

Then, referring to FIG. 23E, the LED chip unit 2360 is disposed on a carrier 2370 reversely where the first film 2352 is between the LED chip 2330 and the carrier 2370 and an adhesion layer 2380 is disposed between the first film 2352 and the carrier 2370.

Figure 23F:
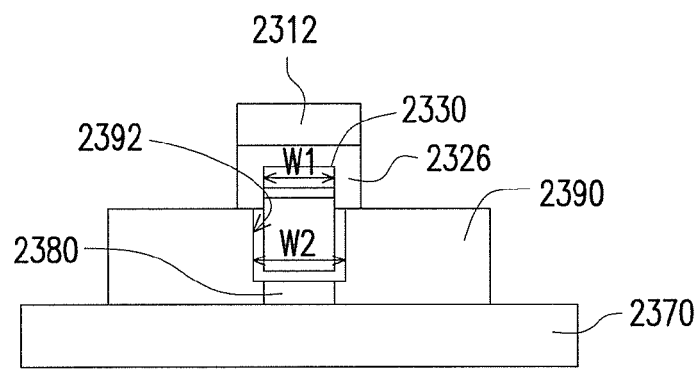

Thereafter, referring to FIG. 23F, a first protrusion 2390 formed by a thermal conductive material is formed on the carrier 2370 and the first protrusion 2390 has a first opening 2392 to expose the LED chip 2330 and a ratio between a width W2 of the first opening 2392 and a width W1 of the LED chip 2330 being larger than 1 and smaller than or equal to 1.5.

Figure 23G:
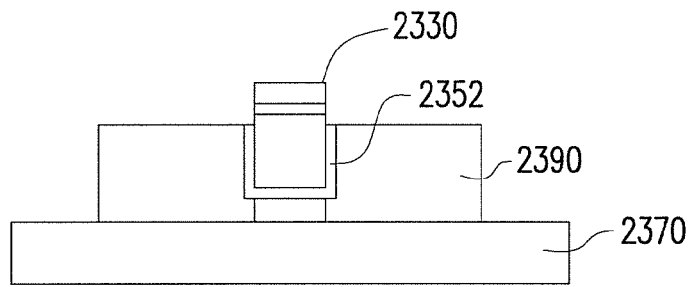

Next, referring to FIG. 23G, the first adhesion layer 2326 and the first temporary substrate 2312 are removed so as to expose the LED chip 2330.

Figure 26:
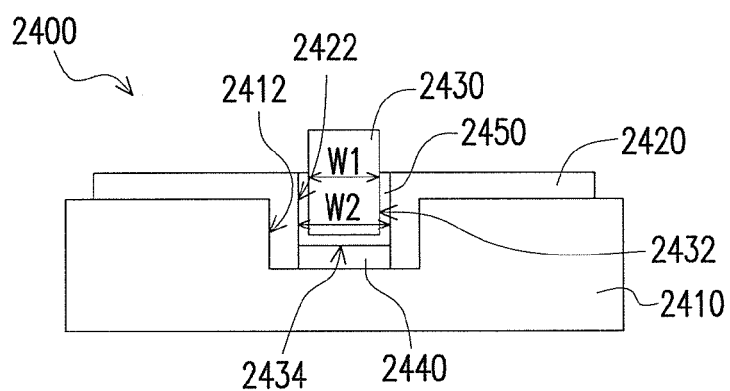
FIG. 26 is a schematic cross-sectional view depicting a light emitting diode package structure according to an embodiment.

FIG. 26 is a schematic cross-sectional view depicting a light emitting diode package structure according to an embodiment.

Referring to FIG. 26, in this embodiment, a light emitting diode package structure 2400 comprises a carrier 2410, a thermal conductive layer 2420, a LED chip 2430, an adhesion layer 2440, and a film 2450. The carrier 2410 has a recess 2412 and the LED chip 2430 is disposed therein. The thermal conductive layer 2420 is disposed on the carrier 2410 and in the recess 2412 wherein the portion of the thermal conductive layer 2420 in the recess 2412 is between the LED chip 2430 and the carrier 2410. The thermal conductive layer 2420 has an opening 2422 and the LED chip 2430 is disposed therein. A ratio between a width W2 of the opening 2422 and a width W1 of the LED chip 2430 being larger than 1 and smaller than or equal to 1.5. The film 2450 is disposed on a sidewall 2432 and a bottom 2434 of the LED chip 2430 and the film 2450 is single or multi-layered and is an adhesion layer, a mirror layer, a barrier layer or a seed layer. The adhesion layer 2440 is between the LED chip 2430 and the carrier 2410.

Figure 27:
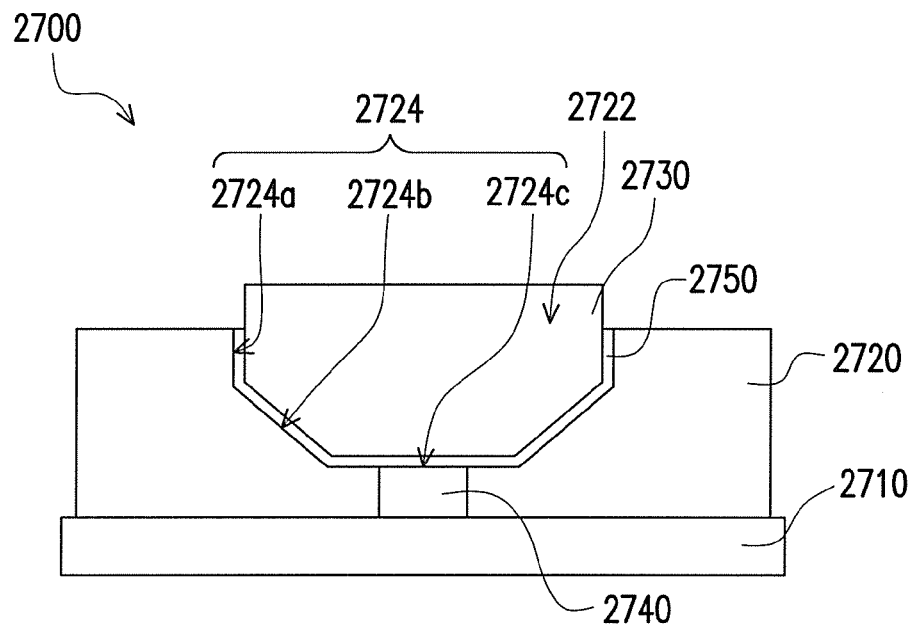
FIG. 27 is a schematic cross-sectional view depicting a light emitting diode package structure according to an embodiment.

FIG. 27 is a schematic cross-sectional view depicting a light emitting diode package structure according to an embodiment. Referring to FIG. 27, in this embodiment, a light emitting diode package structure 2700 comprises a carrier 2710, a first protrusion 2720, a LED chip 2730, an adhesion layer 2740 and a film 2750. Herein, the first protrusion 2720 is disposed on the carrier 2710 and has a first opening 2722 to expose the carrier 2710. The first protrusion 2720 may comprise a thermal-conductive material layer. The LED chip 2730 is disposed in the first opening 2722 and on the first protrusion 2720. An inside wall 2724 of the first opening 2722 includes a vertical wall 2724a, a tilt wall 2724b and a horizontal wall 2724c wherein the tilt wall 2724b connects the vertical wall 2724a to the horizontal wall 2724c on which the LED chip 2730 is disposed. The adhesion layer 2740 is disposed between the LED chip 2730 and the carrier 2710. The film 2750 is disposed between the LED chip 2730 and the first protrusion 2720 and between the LED chip 2730 and the adhesion layer 2740. The film 2750 is single or multi-layered and is an adhesion layer, a mirror layer, a barrier layer or a seed layer. It should be notice that the tilt wall 2724b benefits the film 2750 to reflect the light emitted from the LED chip 2730 so as to improve the luminescence efficiency of the light emitting diode package structure 2700.

Figure 28:
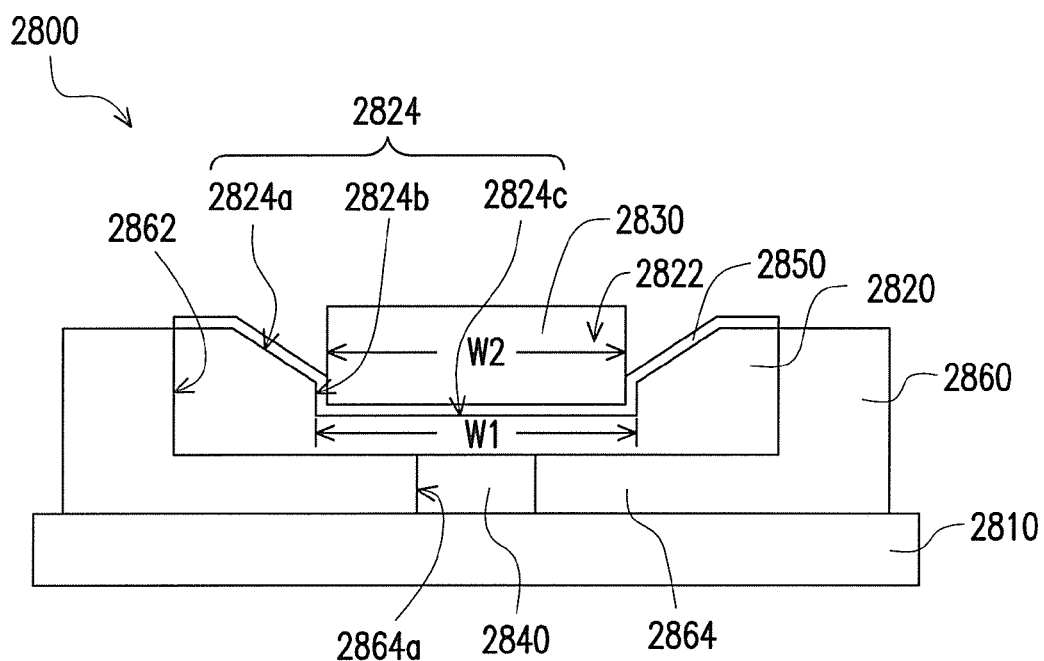
FIG. 28 is a schematic cross-sectional view depicting a light emitting diode package structure according to an embodiment.

FIG. 28 is a schematic cross-sectional view depicting a light emitting diode package structure according to an embodiment. Referring to FIG. 28, in this embodiment, a light emitting diode package structure 2800 comprises a carrier 2810, a thermal conductive layer 2820, a LED chip 2830, an adhesion layer 2840, a film 2850 and a pedestal 2860. Herein, the pedestal 2860 is disposed on the carrier 2810 and has a recess 2862 wherein a bottom 2864 of the recess 2862 has an opening 2864a exposing the carrier 2810. The thermal conductive layer 2820 is disposed in the recess 2862 and has a recess 2822. The thermal conductive layer 2820 may comprise a thermal-conductive material layer. The LED chip 2830 is disposed in the recess 2822 wherein a ratio between a minimum width W1 of the recess 2822 and a second width W2 of the LED chip 2830 being larger than 1 and smaller than or equal to 1.5. An inside wall 2824 of the recess 2822 includes a tilt wall 2824a, a vertical wall 2824b and a horizontal wall 2824c wherein the vertical wall 2824b connects the tilt wall 2824a to the horizontal wall 2824c on which the LED chip 2830 is disposed. The adhesion layer 2840 is disposed in the opening 2864a and between the thermal conductive layer 2820 and the carrier 2810. The film 2850 is disposed on the inside wall 2824 and contacted with the LED chip 2830 and the thermal conductive layer 2820. The film 2850 is single or multi-layered and is an adhesion layer, a mirror layer, a barrier layer or a seed layer, ft should be notice that the tilt wall 2824a benefits the film 2850 to reflect the light emitted from the LED chip 2830 so as to improve the luminescence efficiency of the light emitting diode package structure 2800.

Figure 32:
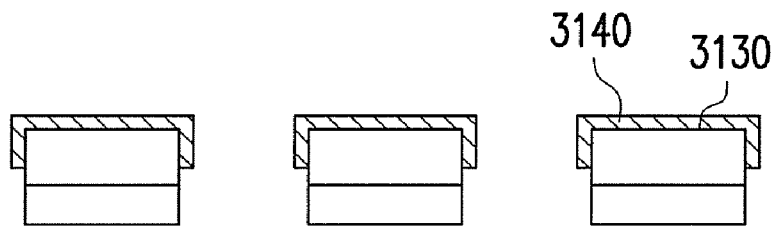
FIG. 32 is schematic cross-sectional views depicting a light emitting diode chip structure according to an embodiment.
Figure 33A:
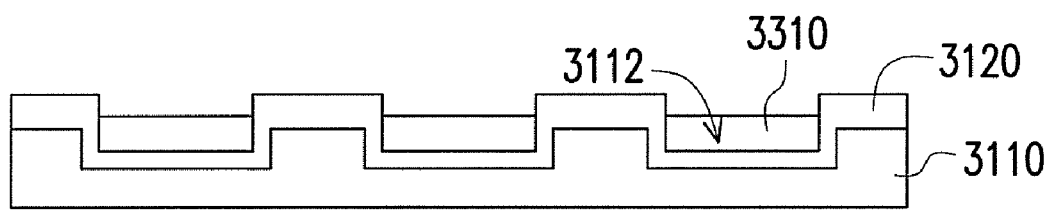
FIGS. 33A~33B are schematic cross-sectional views depicting a process flow for fabricating a light emitting diode chip structure according to another embodiment.
Figure 33B:
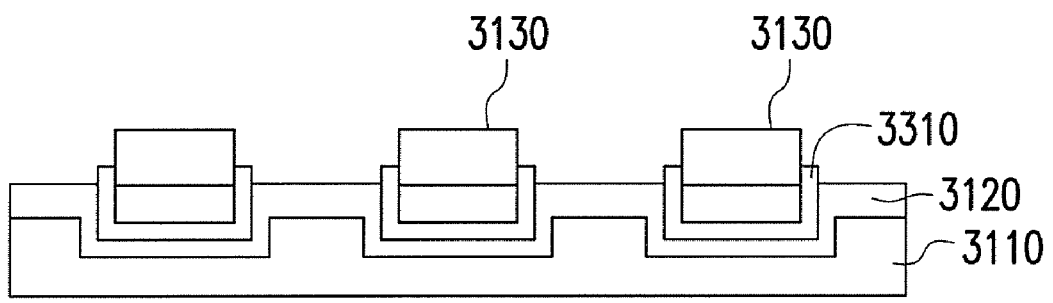

FIGS. 31A~31G are schematic cross-sectional views depicting a process flow for fabricating a light emitting diode chip structure according to one embodiment. FIG. 32 is schematic cross-sectional views depicting a light emitting diode chip structure according to an embodiment. FIGS. 33A~33B are schematic cross-sectional views depicting a process flow for fabricating a light emitting diode chip structure according to another embodiment.

Figure 31A:
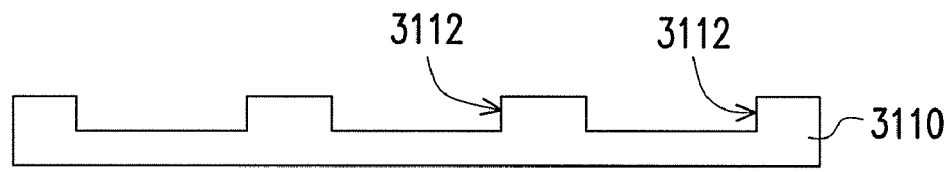
FIGS. 31A~31G are schematic cross-sectional views depicting a process flow for fabricating a light emitting diode chip structure according to one embodiment.
Figure 31B:
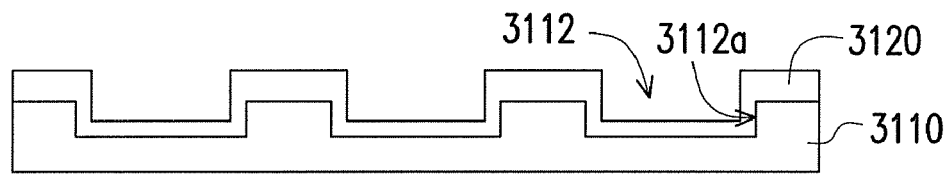

Referring to FIG. 31A, a carrier 3110 with a plurality of recesses 3112 is provided. Then, referring to FIG. 31B, a releasable film 3120 is formed on the carrier 3110 and covers the inside wall 3112a of the recesses 3122. Next, referring to FIG. 31C, a plurality of LED chips 3130 are disposed in the recesses 3112 respectively. Thereafter, referring to FIG. 31D, a film 3140 is formed on the LED chips 3130 and the releasable film 3120. The film 3140 is single or multi-layered and is an adhesion layer, a mirror layer, a barrier layer or a seed layer. Then, referring to FIG. 32, the carrier 3110 and the releasable film 3120 are removed.

Figure 31C:
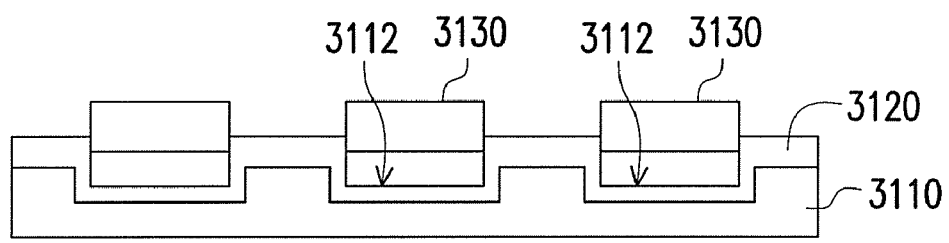

In addition, referring to FIG. 33A, a releasable material 3310 is disposed in the recesses 3112 before the step of FIG. 31C. The releasable material 3310 is photoresist, for example. Then, referring to FIG. 33B, the LED chips 3130 are disposed on the releasable material 3310. Thereafter, referring to FIG. 32, the carrier 3110, the releasable film 3120 and the releasable material 3310 are removed.

Figure 31D:
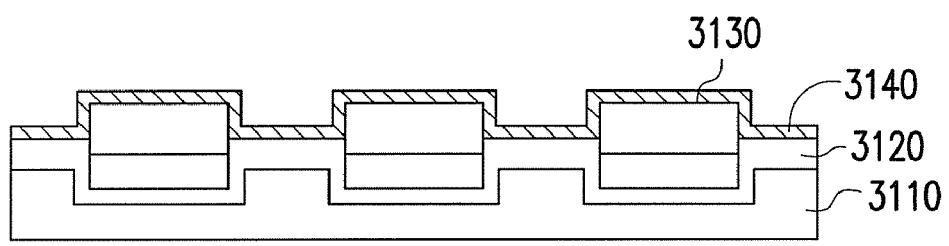
Figure 31E:
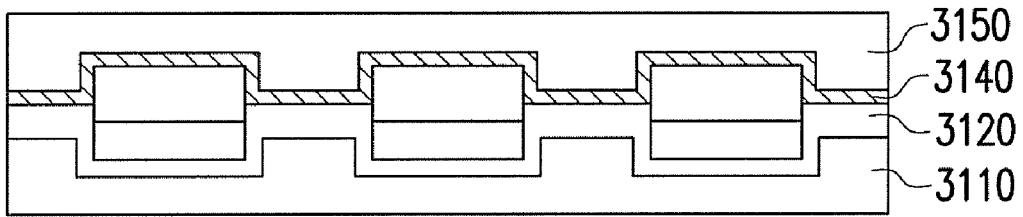
Figure 31F:
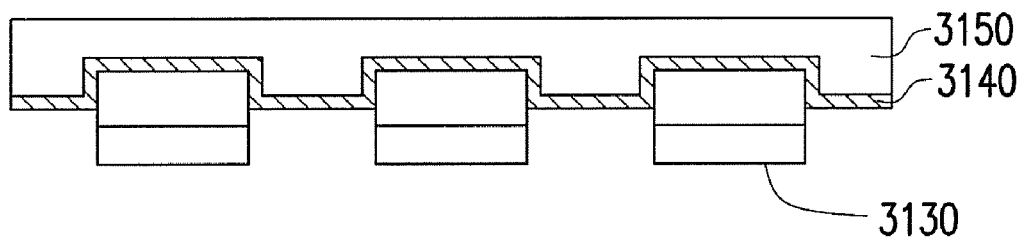
Figure 31G:
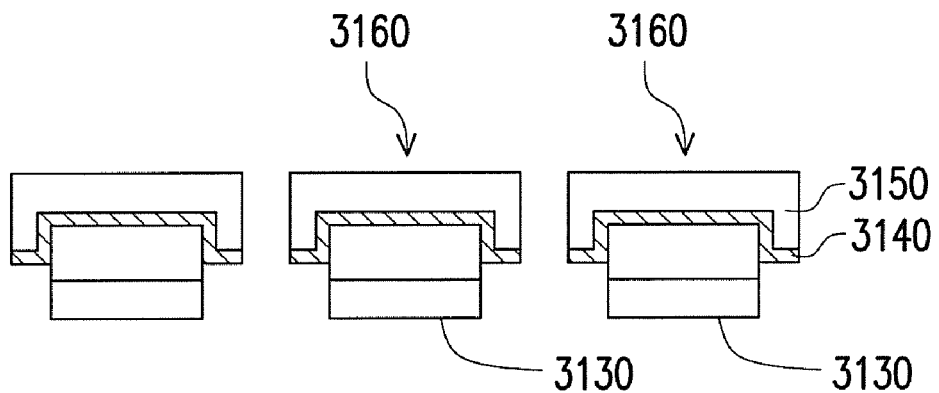

Besides, after the step of FIG. 31D, referring to FIG. 31E, a thermal conductive layer 3150 is formed on the film 3140. Then, referring to FIG. 31F, the carrier 3110 and the releasable film 3120 are removed. Thereafter, referring to FIG. 31G, the thermal conductive layer 3150 and the film 3140 between the LED chips 3130 are sliced so as to form a plurality of LED chip structures 3160. Each of the LED chip structures 3160 has a LED chip 3130, a portion of the film 3140 and a portion of the thermal conductive layer 3150.

To sum up, the light emitting diode package structure of the present invention has at least the following advantages:

1. The light emitting diode package structure of the present invention comprises the first protrusion formed by a thermal conductive material, and the first protrusion is attached to the sidewall of the LED chip. Hence, the first protrusion of the present invention is adapted for enhancing thermal conduction efficiency of the sidewall of the LED chip. Consequently, the first protrusion helps the light emitting diode package structure to prevent reducing light emitting efficiency or damaging the LED chip.

2. Compared with a conventional carrier, the first protrusion of the present invention is closer to the light emitting layer of the LED chip. Therefore, the first protrusion helps to rapidly remove the heat generated by the light emitting layer of the LED chip.

3. The first protrusion and the carrier of the present invention are formed in one piece and formed by the same material. As a consequence, the heat generated by the LED chip is rapidly transferred to the carrier through the first protrusion, so as to achieve better heat dissipation of the light emitting diode package structure.

4. The adhesion layer of the present invention not only bonds the LED chip to the carrier but also bonds the LED chip to the first protrusion. Consequently, the LED chip and the first protrusion are steadily bonded. In addition, the heat generated by the LED chip is transferred to the first protrusion and the carrier through the adhesion layer.

5. The second fluorescent material layer of the present invention has a uniform thickness, and therefore a light emitted by the light emitting diode package structure has uniform color.

6. The first protrusion of the present invention has an extending portion contacting the bottom of the LED chip so as to enhance thermal conduction efficiency of the bottom of the LED chip besides enhancing thermal conduction efficiency of the sidewall of the LED chip.

Although the present invention has been disclosed by the above preferable embodiments, they are not intended to limit the present invention. Persons skilled in this art may make some modifications without departing from the spirit and scope of the present invention. Therefore, the protection range of the present invention falls in the appended claims.

What is claimed is:

1. A light emitting diode (LED) package structure, comprising:
    a carrier;
    a first protrusion disposed on the carrier and having a first opening to expose the carrier;
    a LED chip disposed in the first opening on the carrier, and a ratio between a width of the first opening and a width of the LED chip being 1 approximately; and
    an adhesion layer disposed between the LED chip and the carrier to bond the LED chip to the carrier, wherein a projection area of the adhesion layer to the carrier is smaller than a projection area of the LED chip to the carrier and there is a gap between the LED chip and the carrier and the first protrusion has an extending portion filling the gap.

2. The LED package structure as claimed in claim 1, wherein the first protrusion comprises a thermal-conductive material layer.

3. The LED package structure as claimed in claim 2, wherein a material of the thermal-conductive material layer comprises gold, silver, copper, indium, titanium, zinc, aluminum, lead, tin, nickel, platinum, chromium, or a combination of alloys thereof.

4. The LED package structure as claimed in claim 1, wherein the first protrusion comprises a stack of a plurality of thermal-conductive material layers.

5. The LED package structure as claimed in claim 4, wherein a material of the thermal-conductive material layers comprise gold, silver, copper, indium, titanium, zinc, aluminum, lead, tin, nickel, platinum, chromium, or a combination of alloys thereof.

6. The LED package structure as claimed in claim 1, further comprising a reflective layer disposed on the first protrusion, and the first protrusion comprising a first thermal-conductive material layer and a second thermal-conductive material layer disposed between the first thermal-conductive material layer and the reflective layer, wherein the first thermal-conductive material layer is disposed on the carrier.

7. The LED package structure as claimed in claim 6, wherein a material of the first thermal-conductive material layer is copper, a material of the second thermal-conductive material layer is nickel, and a material of the reflective layer is silver.

8. The LED package structure as claimed in claim 1, wherein the carrier comprises a main body and a pedestal protruding from the main body and the LED chip is disposed on the pedestal and the width of the pedestal is smaller than the width of LED chip and the adhesion layer is disposed between the pedestal and the LED chip.

9. The LED package structure as claimed in claim 8, wherein the pedestal has a first end connecting the main body and a second end extending toward the LED chip and the width of the pedestal is gradually decreased along a direction from the first end to the second end.

10. The LED package structure as claimed in claim 1 wherein the carrier has a center portion and a periphery portion around the center portion and the material of the center portion includes copper and the materials of the periphery portion include insulating material or plastic material.

11. The LED package structure as claimed in claim 1, wherein the first thermal-conductive material layer is thinner than the LED chip.

12. The LED package structure as claimed in claim 1, further comprising a plurality of first adhesion layers disposed between the LED chip and the carrier respectively.

13. The LED package structure as claimed in claim 12, wherein the first adhesion layers are disposed at four corners of the LED chip respectively.

14. The LED package structure as claimed in claim 1, further comprising a fluorescent material layer disposed in the first opening.

15. The LED package structure as claimed in claim 1, wherein the LED chip has a surface facing away from the carrier and the surface has a trench passing through a light emitting layer of the LED chip.

16. The LED package structure as claimed in claim 15, wherein the trench located on the edge of the LED chip.

17. The LED package structure as claimed in claim 1, further comprising a film disposed on the LED chip and between the LED chip and the adhesion layer.

18. The LED package structure as claimed in claim 17, wherein the film is single or multi-layered and the film is an adhesion layer, a mirror layer, a barrier layer or a seed layer.

19. A light emitting diode (LED) package structure, comprising:

a carrier;
a pedestal disposed on the carrier and having a first recess wherein a bottom of the first recess has an opening exposing the carrier;
a thermal conductive layer disposed in the first recess and has a second recess having an inside wall including a tilt wall, a vertical wall and a horizontal wall wherein the vertical wall connects the tilt wall to the horizontal wall;
a LED chip disposed in the second recess and on the horizontal wall wherein a ratio between a minimum width of the second recess and a second width of the LED chip being larger than 1 and smaller than or equal to 1.5;
a film disposed on the inside wall; and
an adhesion layer disposed in the opening and between the thermal conductive layer and the carrier.

20. The light emitting diode package structure as claimed in claim 19, wherein the film is single or multi-layered and the film is a first adhesion layer, a minor layer, a barrier layer or a seed layer.

* * * * *